United States Patent
Wang et al.

(10) Patent No.: US 12,324,147 B2
(45) Date of Patent: Jun. 3, 2025

(54) METHOD FOR FORMING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Jinghao Wang, Hefei (CN); Junbo Pan, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 462 days.

(21) Appl. No.: 17/854,228

(22) Filed: Jun. 30, 2022

(65) Prior Publication Data

US 2023/0079234 A1   Mar. 16, 2023

Related U.S. Application Data

(63) Continuation of application No. PCT/CN2021/137523, filed on Dec. 13, 2021.

(30) Foreign Application Priority Data

Sep. 13, 2021  (CN) .......................... 202111068450.0

(51) Int. Cl.
*H01L 27/108* (2006.01)
*H01L 21/67* (2006.01)
*H10B 12/00* (2023.01)

(52) U.S. Cl.
CPC ..... *H10B 12/482* (2023.02); *H01L 21/67075* (2013.01); *H10B 12/488* (2023.02)

(58) Field of Classification Search
CPC ................ H10B 12/482; H10B 12/488; H10B 12/0335; H10B 12/485; H01L 21/67075; H01L 21/32139
See application file for complete search history.

(56) References Cited

U.S. PATENT DOCUMENTS 6,091,094 A * 7/2000 Rupp ................... H10B 12/395
                                                                438/242
8,779,422 B2   7/2014 Lee
(Continued)

FOREIGN PATENT DOCUMENTS

CN   102867828 A   1/2013
CN   103000584 A   3/2013
(Continued)

*Primary Examiner* — Jarrett J Stark
(74) *Attorney, Agent, or Firm* — Syncoda LLC; Feng Ma

(57) ABSTRACT

A method for forming a semiconductor structure includes: a substrate is provided, in which active areas arranged in a matrix and isolation structures for isolating active areas from each other are formed in substrate, a first direction is a column direction of matrix and a second direction is a row direction of matrix; a conductive layer is formed on substrate; at least conductive layer is etched to form a plurality of bit line grooves extending along first direction and arranged along second direction and a plurality of conductive lines extending along first direction and arranged along second direction; a bit line structure is formed in each bit line groove, in which a gap is formed between bit line structure and each of two sides of a respective one of bit line grooves; and conductive lines are etched along second direction to form conductive pillars serving as storage node contact structures.

13 Claims, 31 Drawing Sheets

(56) References Cited

U.S. PATENT DOCUMENTS

| | | | |
|---|---|---|---|
| 9,184,227 B1* | 11/2015 | Kim | H10D 30/63 |
| 2012/0299073 A1* | 11/2012 | Mikasa | H10B 12/053 |
| | | | 257/296 |
| 2013/0009153 A1 | 1/2013 | Lee | |
| 2014/0306278 A1 | 10/2014 | Lee et al. | |
| 2019/0273082 A1* | 9/2019 | Wu | H10B 12/315 |
| 2020/0058668 A1* | 2/2020 | Son | H10B 43/30 |
| 2020/0266207 A1 | 8/2020 | Liu | |
| 2020/0286894 A1* | 9/2020 | Lin | H10B 12/0335 |
| 2021/0035613 A1 | 2/2021 | Park et al. | |
| 2021/0249353 A1 | 8/2021 | Sayama et al. | |
| 2022/0045100 A1 | 2/2022 | Liu | |
| 2022/0085158 A1* | 3/2022 | Park | H01L 21/76879 |
| 2022/0359400 A1* | 11/2022 | Lee | H01L 23/5329 |
| 2022/0406789 A1* | 12/2022 | Jeon | H10B 12/482 |
| 2023/0008414 A1* | 1/2023 | Pan | H10B 12/34 |
| 2023/0102043 A1* | 3/2023 | Yoon | H01L 21/76831 |
| | | | 257/296 |
| 2023/0301070 A1* | 9/2023 | Xiao | H01L 29/7827 |
| 2023/0354586 A1* | 11/2023 | Cui | H10B 12/50 |
| 2023/0380144 A1* | 11/2023 | Park | H10B 12/34 |
| 2024/0014278 A1* | 1/2024 | Tsai | H10B 12/34 |
| 2024/0015947 A1* | 1/2024 | Tsai | H10B 12/315 |
| 2024/0021691 A1* | 1/2024 | Tsai | H01L 29/4236 |
| 2024/0049453 A1* | 2/2024 | Shao | H10B 12/488 |
| 2024/0057312 A1* | 2/2024 | Shao | H10B 12/036 |
| 2024/0074165 A1* | 2/2024 | Kim | H10B 12/485 |
| 2024/0172422 A1* | 5/2024 | Baik | H10B 12/485 |

FOREIGN PATENT DOCUMENTS

| | | |
|---|---|---|
| CN | 105448919 B | 7/2018 |
| CN | 109979940 A | 7/2019 |
| CN | 112310082 A | 2/2021 |
| WO | 2020168449 A1 | 8/2020 |

* cited by examiner

METHOD FOR FORMING SEMICONDUCTOR STRUCTURE AND SEMICONDUCTOR STRUCTURE

CROSS-REFERENCE TO RELATED APPLICATIONS

The disclosure is a continuation application of International Patent Application No. PCT/CN2021/137523, filed on Dec. 13, 2021, which claims priority to Chinese Patent Application No. 202111068450.0, filed on Sep. 13, 2021 and entitled "METHOD FOR FORMING SEMICONDUCTOR STRUCTURE AND SEMICONDUCTOR STRUCTURE". The disclosures of International Patent Application No. PCT/CN2021/137523 and Chinese Patent Application No. 202111068450.0 are hereby incorporated by reference in their entireties.

BACKGROUND

In semiconductor devices, such as Dynamic Random Access Memories (DRAMs), polysilicon is usually used to prepare Storage Node Contact (SNC) structures between Bit Lines (BLs) and active areas.

When the polysilicon is used to prepare the SNC structures located between the BLs, since a width-to-depth ratio of positions that need to be filled with the polysilicon is too high, voids appear at bottoms of the formed SNC structures, thereby affecting yield.

SUMMARY

The disclosure relates to the technical field of semiconductors. The disclosure relates to, but is not limited to, a method for forming a semiconductor structure, and a semiconductor structure.

Embodiments of the disclosure provide a method for forming a semiconductor structure, and a semiconductor structure.

In a first aspect, the embodiments of the disclosure provide a method for forming a semiconductor structure, including the following operations.

A substrate is provided, in which active areas arranged in a matrix and isolation structures for isolating the active areas from each other are formed in the substrate, a first direction is a column direction of the matrix and a second direction is a row direction of the matrix, and a third direction is an extension direction of each active area.

A conductive layer is formed on the substrate.

At least the conductive layer is etched to form a plurality of bit line grooves extending along the first direction and arranged along the second direction and a plurality of conductive lines extending along the first direction and arranged along the second direction, in which each bit line groove exposes one column of the active areas, and bottom surfaces of the plurality of bit line grooves are lower than a top surface of the substrate.

A bit line structure is formed in each bit line groove, in which a gap is formed between the bit line structure and each of two sides of a respective one of the plurality of bit line grooves.

The plurality of conductive lines are etched along the second direction to form conductive pillars serving as storage node contact structures.

In a second aspect, the embodiments of the disclosure provide a semiconductor structure, including:

a substrate, in which active areas arranged in a matrix and isolation structures for isolating the active areas from each other are formed in the substrate, a first direction is a column direction of the matrix and a second direction is a row direction of the matrix, and a third direction is an extension direction of each active area;

a plurality of bit line grooves extending along the first direction and arranged along the second direction, in which each bit line groove exposes one column of the active areas, and bottom surfaces of the plurality of bit line grooves are lower than a top surface of the substrate;

a bit line structure located in each bit line groove, in which a gap is formed between the bit line structure and each of two sides of a respective one of the plurality of bit line grooves; and conductive pillars serving as storage node contact structures.

BRIEF DESCRIPTION OF THE DRAWINGS

In the drawings (which are not necessarily drawn to scale), similar reference numerals may denote similar components in different views. The similar reference numerals having different letter suffixes may denote different examples of the similar components. The drawings generally illustrate various embodiments discussed in the disclosure by way of example and not by way of limitation.

Figure 1A:
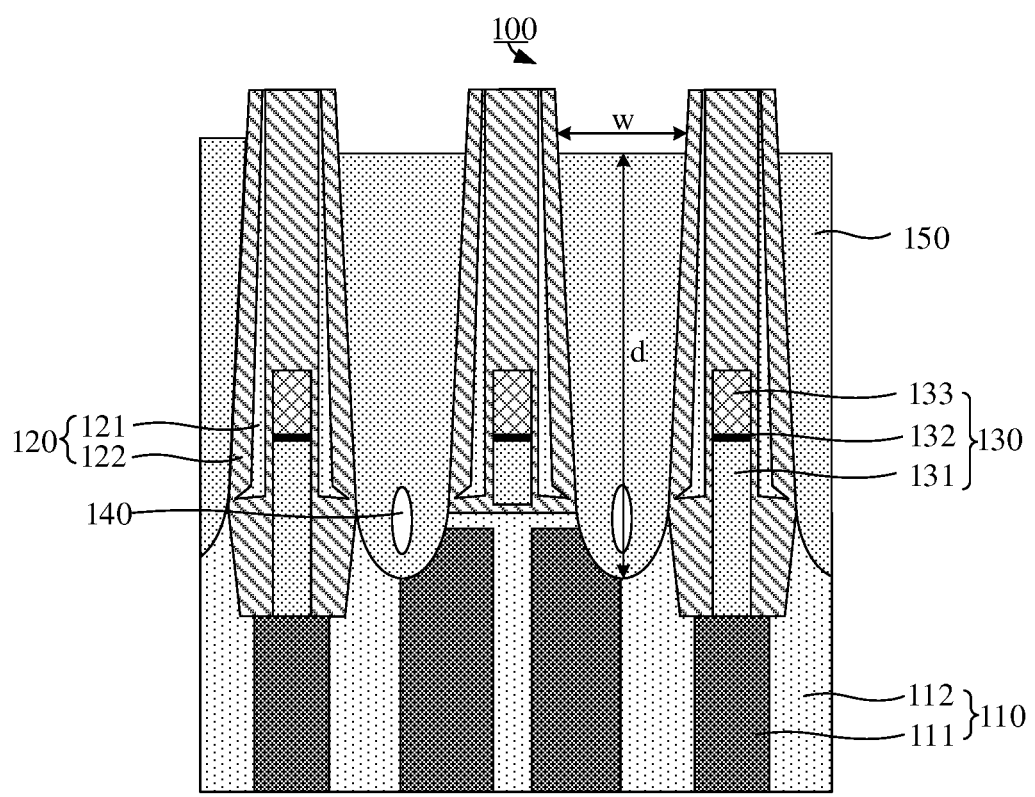
FIG. 1A is a schematic cross-sectional diagram of a semiconductor structure in the related art.

Description of reference numerals is as follows:
100—semiconductor structure; 200/110—substrate; 120—insulation structure; 112—isolation area; 131—bit line contact layer; 132—bit line barrier layer; 133—bit line conductive layer; 140—void; 150—storage node contact structure; 201/111—active area; 202—isolation structure; 203—word line structure; 203a—word line metal layer; 203b—word line dielectric layer; 203c—opening; 204—isolation layer; 205—conductive layer; 206—bit line groove; 206a—gap; 207—conductive line; 207a—conductive pillar; 208/130—bit line structure; 208a—first conductive barrier layer; 208b—first metal layer; 209—first mask layer; 209a—first photoresist layer; 210—first mask pattern; 210a—first window; 211a—initial first conductive barrier layer; 211b—initial first metal layer; 212—first sacrificial layer; 213—second mask layer; 214—second photoresist layer; 215—second mask pattern; 215a—second window; 216—first insulation layer; 216a—initial first insulation layer; 217—second sacrificial layer 218—third mask pattern; 218a—third window; 219—second insulation layer; 220—second conductive barrier layer; 221—second metal layer.

DETAILED DESCRIPTION

Exemplary implementations of the disclosure will be described in more detail below with reference to the drawings. Although the drawings illustrate the exemplary implementations of the disclosure, it should be understood that the disclosure can be implemented in multiple forms, and should not be limited by the particular implementations described here. On the contrary, the purpose of providing these implementations is to more thoroughly understand the disclosure, and the scope of the disclosure may be fully conveyed to persons skilled in the art.

In the following description, numerous specific details are given in order to provide a more thorough understanding of the disclosure. However, it is apparent to persons skilled in the art that the disclosure may be implemented without one or more of these details. In other examples, in order to avoid confusion with the disclosure, some technical features well known in the art are not described. That is, all the features of the actual embodiments are not described herein, and well-known functions and structures are not described in detail.

FIG. 1A is a schematic cross-sectional diagram of a semiconductor structure in the related art. As shown in FIG. 1A, a semiconductor structure 100 includes a substrate 110, insulation structures 120, bit line structures 130, and storage node contact structures 150.

The substrate 110 includes active areas 111 arranged at intervals and isolation areas 112 arranged at intervals, and the isolation areas 112 isolate two adjacent active areas 111 from each other. The storage node contact structures 150 are coupled to the active areas 111 and other structures in the semiconductor structure 100.

The insulation structures 120 are configured to isolate the bit line structures 130 and the storage node contact structures 150, and to isolate the bit line structures 130 and the substrate 110.

Each bit line structure 130 includes a bit line contact layer 131, a bit line barrier layer 132, and a bit line conductive layer 133, and the bit line barrier layer 132 is located between the bit line contact layer 131 and the bit line conductive layer 133.

The storage node contact structure 150 is formed by filling a contact hole located between two adjacent insulation structures 120, and a ratio of a depth d to a width w of the contact hole between the two adjacent insulation structures 120 is relatively large, thus a void 140 may appear on a side of the storage node contact structure 150 close to a surface of the substrate 110, thereby affecting the performance of the storage node contact structure.

Parasitic capacitance may be generated between the bit line structure 130 and the storage node contact structure 150, thereby affecting the performance of a device. In order to reduce the parasitic capacitance as much as possible, each insulation structure 120 includes at least an oxide layer 121 and a silicon nitride layer 122. Each insulation structure 120 may also include three layers, i.e., nitride layer-oxide layer-nitride layer (Nitride-Oxide-Nitride, N—O—N), and in this case, the oxide layer is located between the two nitride layers. In addition, the bottom of the bit line structure 130 needs to be filled with silicon nitride, leading to a complicated process, and in addition, the process is difficult due to relatively weak filling ability of the silicon nitride.

Figure 1B:
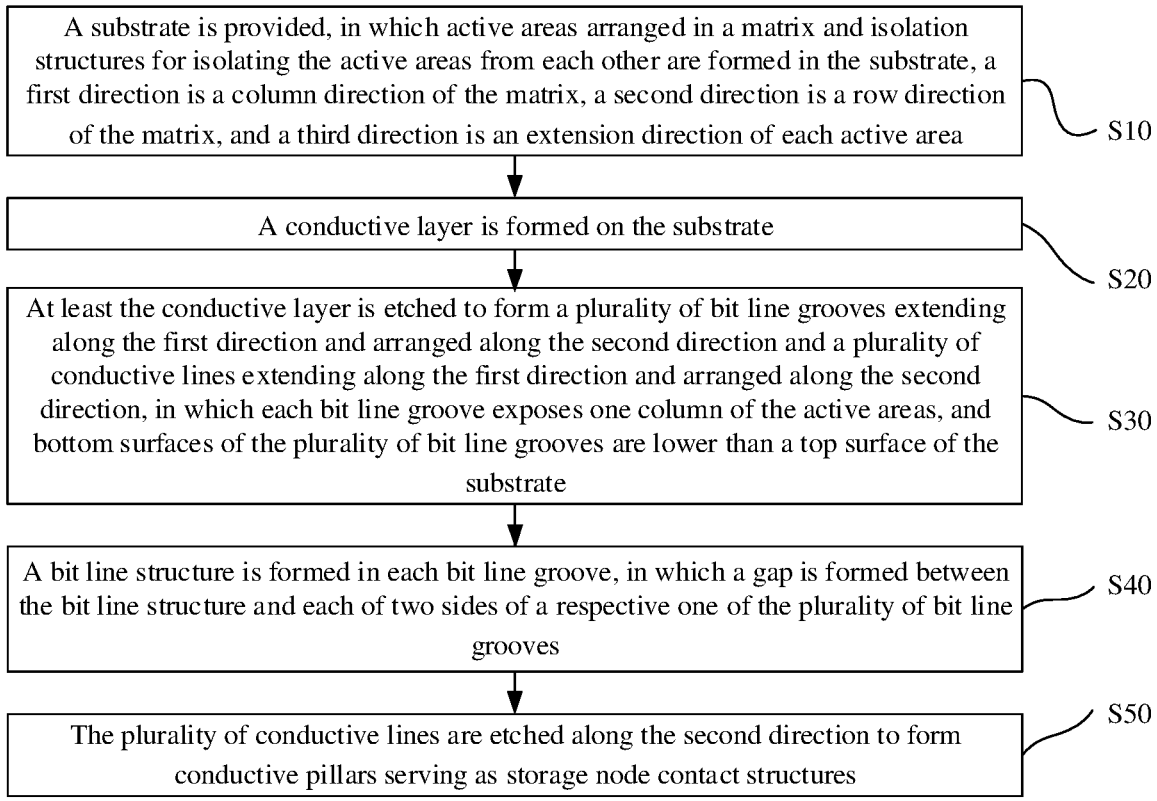
FIG. 1B is a schematic flowchart of a method for forming a semiconductor structure provided by embodiments of the disclosure.

In order to solve the above problems, FIG. 1B is a schematic flowchart of a method for forming a semiconductor structure provided by embodiments of the disclosure. Next, with reference to FIG. 1B to FIG. 1H, the method for manufacturing a semiconductor structure provided by the embodiment of the disclosure is further described in detail. Left diagrams in FIG. 1C to FIG. 1H are schematic layout diagrams, and right diagrams in FIG. 1C to FIG. 1H are cross-sectional diagrams corresponding to the left diagrams respectively.

FIG. 1B is a schematic flowchart of a method for forming a semiconductor structure provided by embodiments of the disclosure. As shown in FIG. 1B, the method includes the following operations.

At S10, a substrate is provided, in which active areas arranged in a matrix and isolation structures for isolating the active areas from each other are formed in the substrate, a first direction is a column direction of the matrix and a second direction is a row direction of the matrix, and a third direction is an extension direction of each active area.

Here, the substrate may be a silicon (Si) substrate, a germanium (Ge) substrate, a silicon germanium (SiGe) substrate, a gallium arsenide substrate, a ceramic substrate, a quartz substrate, or a glass substrate for a display, and may also include multiple layers, such as a Silicon On Insulator (SOI) substrate, a Germanium On Insulator (GOI) substrate, or the like.

In some embodiments, a portion of the substrate may be doped to form n-type doped active areas, and a doped element may be phosphorus, arsenic, boron, or other suitable elements.

Here, the substrate may include a top surface located on a front surface and a bottom surface located on a back surface opposite to the front surface. In the direction of the top surface and the bottom surface of the substrate (i.e., a plane where the substrate is located), two directions, i.e., a first direction and a second direction, that intersect with each other (for example, are perpendicular to each other) are defined. For example, the column direction of the matrix may be defined as the first direction, the row direction of the matrix may be defined as the second direction, and the direction of the plane of the substrate may be determined based on the first direction and the second direction. The first direction and the second direction are perpendicular to each other, and the third direction is interposed between the first direction and the second direction. In the embodiment of the disclosure, the first direction is defined as an X-axis direction, the second direction is defined as a Y-axis direction, and the third direction is defined as a Z-axis direction.

Here, word line structures may also be formed in the substrate, and the word line structures extend along the Y-axis direction and are arranged along the X-axis direction. The word line structures may be located in the active areas or in the isolation structures.

Figure 1C:
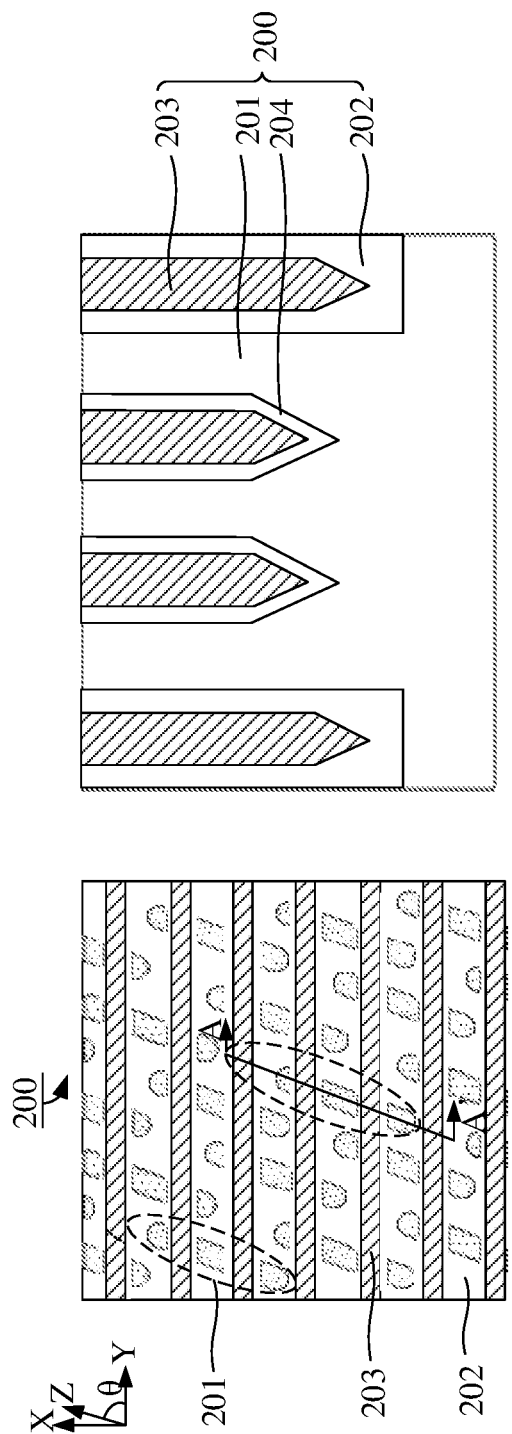
FIG. 1C to FIG. 1H are schematic diagrams of a process for forming a semiconductor structure provided by embodiments of the disclosure, in which left diagrams in FIG. 1C to FIG. 1H are schematic layout diagrams, and right diagrams in FIG. 1C to FIG. 1H are cross-sectional diagrams corresponding to the left diagrams respectively.

The structure of the substrate is shown in FIG. 1C. The left diagram of FIG. 1C shows the layout of the substrate, and the right diagram of FIG. 1C shows a cross-sectional diagram along A-N. A substrate 200 includes active areas 201 arranged in a matrix and isolation structures 202 for isolating the active areas 201 from each other. The X-axis direction is the column direction of the matrix and the Y-axis direction is the row direction of the matrix. The Z-axis direction is an extension direction of each active area 201. The active areas 201 may be strip-shaped.

The active area 201 may be configured to form a transistor, the material of the active area 201 may be N-type or P-type doped monocrystalline silicon, and the doping type of the monocrystalline silicon determines the type of the transistor corresponding to the active area 201. The active area 201 may include a source area, a drain area, and a channel area of a transistor.

Each isolation structure 202 is configured to isolate two adjacent active areas 201, and each isolation structure 202 is formed by filling a contact hole located between the two adjacent active areas 201. The material of the isolation structure 202 is an insulation material, and may include one or more of oxides. For example, the material of the isolation structure 202 is silicon dioxide. In some embodiments, the isolation structure 202 may serve as Shallow Trench Isolation (STI).

In some embodiments, with reference to FIG. 1C, word line structures 203 arranged along the X-axis direction and extending along the Y-axis direction and an isolation layer 204 located between the word line structures 203 and the substrate 200 are formed in the substrate. When the semiconductor structure is configured to form a DRAM, each word line structure 203 is coupled to a gate of the transistor in the active area 201.

In some embodiments, there is a certain angle between the extension direction of the word line structure and the extension direction of each active area, in which the angle may be less than 90°.

At S20, a conductive layer is formed on the substrate.

Figure 1D:
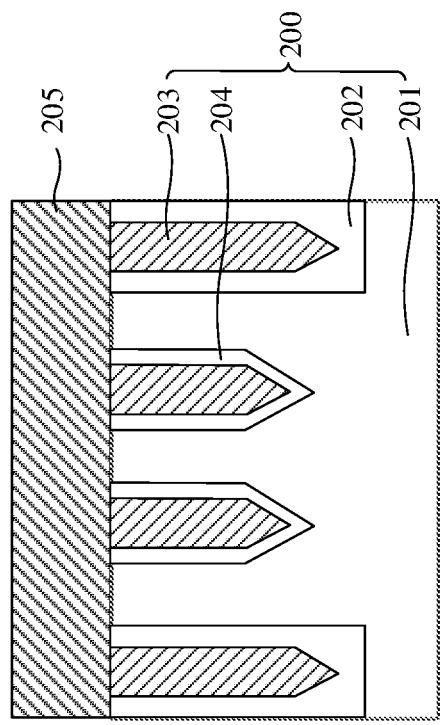
Figure 1D:
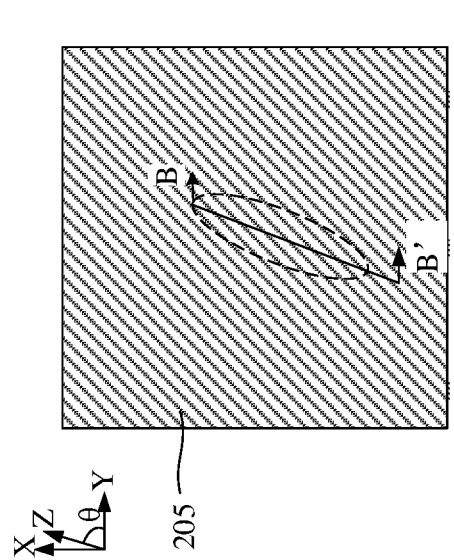

With reference to FIG. 1D, a conductive layer 205 is formed on the substrate 200, and the conductive layer 205 is a continuous whole-layer structure covering a surface of the substrate 200. The material of the conductive layer 205 may be a conductive material containing silicon and has low resistance, such as one or more of amorphous silicon or polysilicon.

At S30, at least the conductive layer is etched to form a plurality of bit line grooves extending along the first direction and arranged along the second direction and a plurality of conductive lines extending along the first direction and arranged along the second direction, in which each bit line groove exposes one column of the active areas, and bottom surfaces of the plurality of bit line grooves are lower than a top surface of the substrate.

Figure 1E:
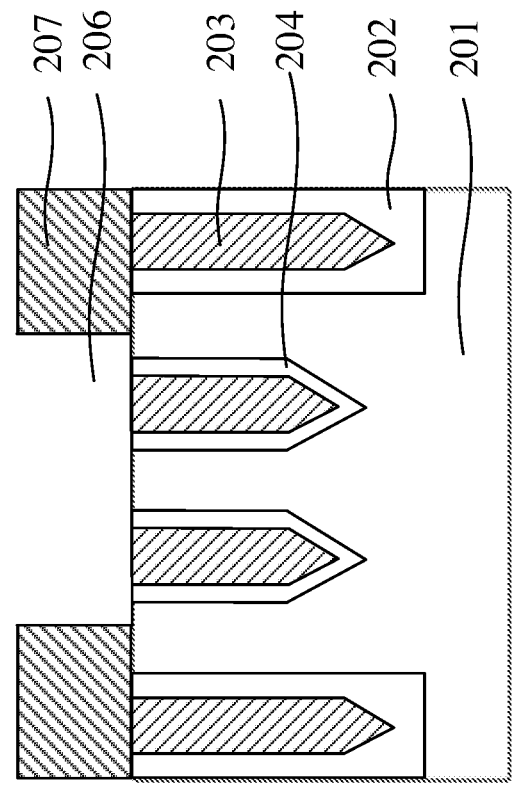
Figure 1E:
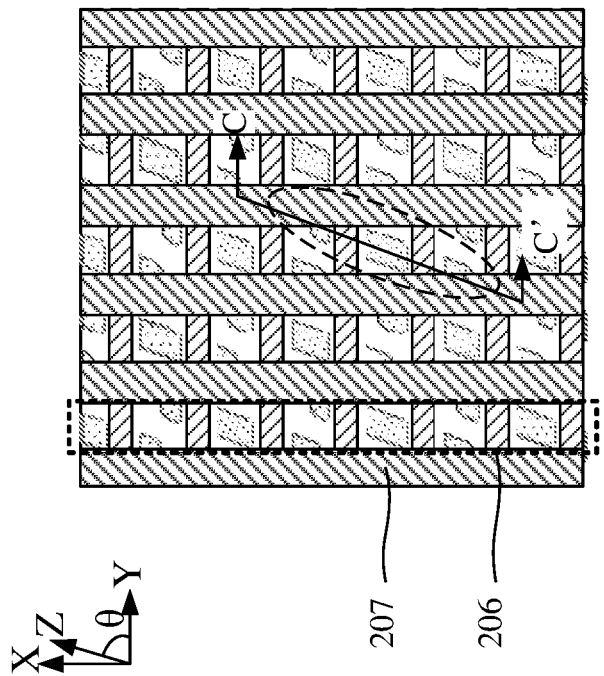

With reference to FIG. 1D, the conductive layer 205 is etched to form a plurality of bit line grooves 206 extending along the X-axis direction and arranged along the Y-axis direction and a plurality of conductive lines 207 extending along the X-axis direction and arranged along the Y-axis direction as shown in FIG. 1E. Each bit line groove 206 exposes one column of active areas 201.

In some embodiments, the bottom surfaces of the plurality of bit line grooves 206 being lower than a top surface of the substrate 200 may include at least the following two cases.

In the first case, with reference to FIG. 1D, the conductive layer 205 is etched to form a plurality of bit line grooves 206 as shown in FIG. 1E. In this case, bottom surfaces of the plurality of bit line grooves 206 are flush with a top surface of the substrate 200. The plurality of bit line grooves 206 include a space formed after the conductive layer 205 is etched.

Figure 1F:
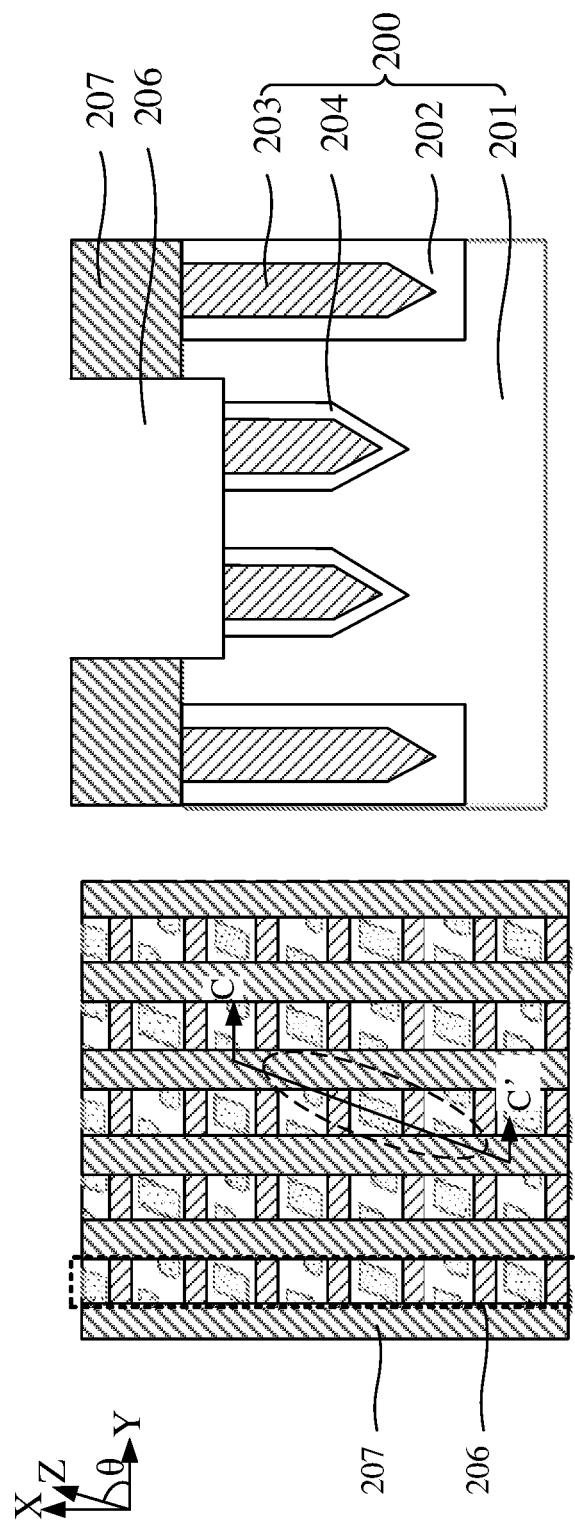

In the second case, with reference to FIG. 1D, the conductive layer 205, a part of the active areas 201, and a part of the word line structures 203 are etched to form the plurality of bit line grooves 206 as shown in FIG. 1F. In this case, the bottom surfaces of the plurality of bit line grooves 206 are flush with the surfaces of the etched word line structures 203, the bottom surfaces of the plurality of bit line grooves 206 are flush with the etched active areas 201, and the bottom surfaces of the plurality of bit line grooves 206 are lower than the top surface of the substrate 200. Each bit line groove 206 includes two parts, one part is the space formed after the conductive layer 205 is etched, and the other part is a space formed on the substrate 200 after the active areas 201 and the word line structures 203 are etched.

At S40, a bit line structure is formed in each bit line groove, in which a gap is formed between the bit line structure and each of two sides of a respective one of the plurality of bit line grooves.

Figure 1G:
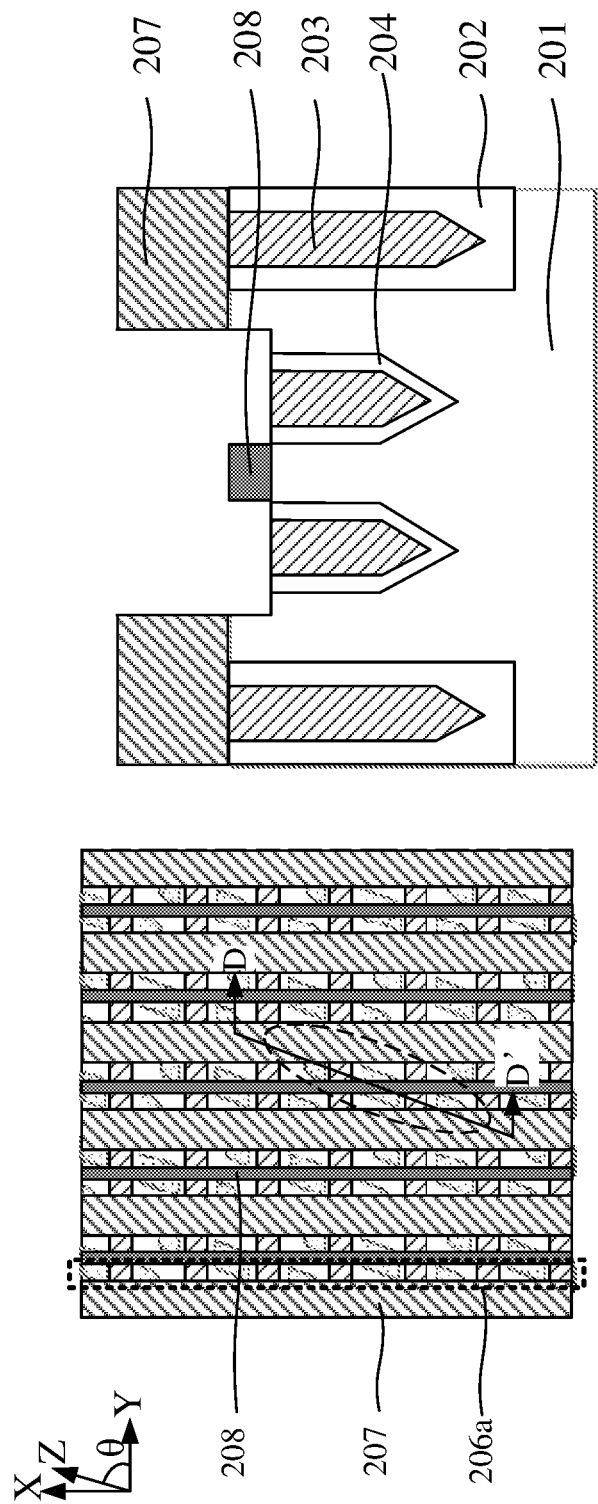

With reference to FIG. 1F, a bit line structure 208 as shown in FIG. 1g is formed in each bit line groove 206. With reference to the left diagram in FIG. 1G, a gap 206a is formed between the bit line structure 208 and each of two sides of a respective one of the plurality of bit line grooves 206. The active area 201 between two adjacent word line structures 203 is configured to form the source area/drain area of the transistor, and the bit line structure 208 is formed on a surface of the source area/drain area, thereby achieving coupling between the bit line structure 208 and the source/drain area. When the semiconductor structure is configured to form a DRAM, the bit line structure is configured to write data to the transistor corresponding to the source/drain area.

At S50, the plurality of conductive lines are etched along the second direction to form conductive pillars serving as storage node contact structures.

Figure 1H:
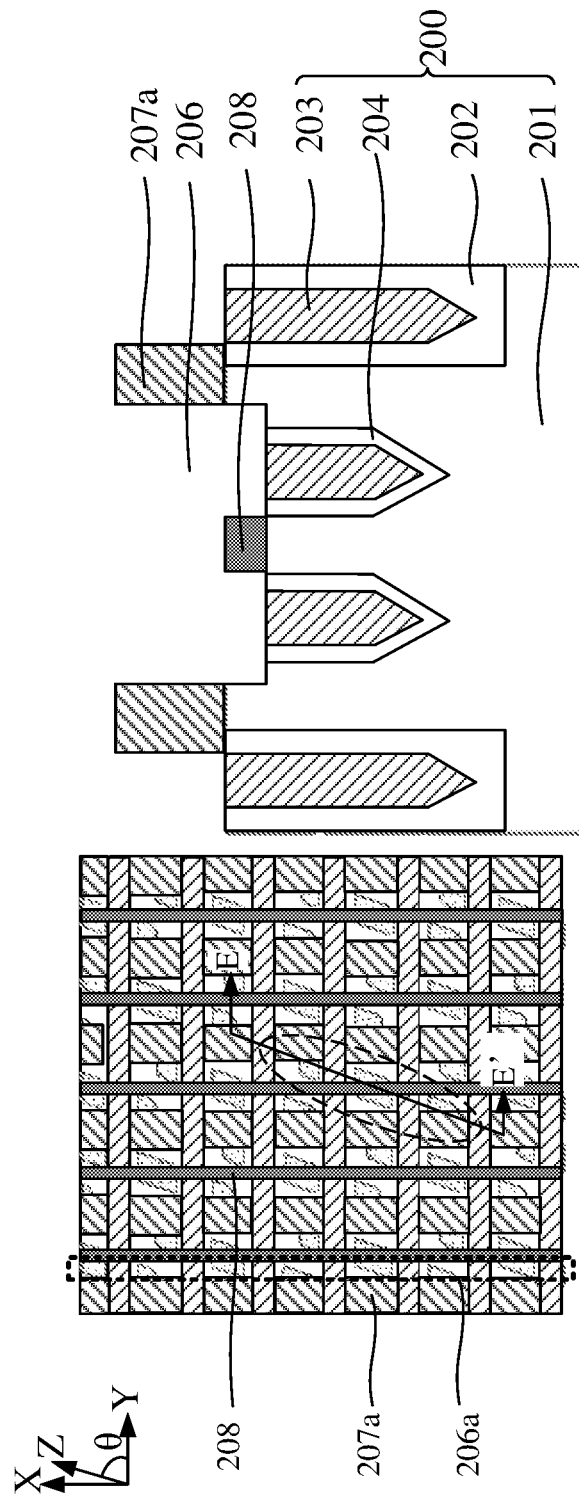

With reference to FIG. 1G, the plurality of conductive lines 207 are etched along the Y-axis direction to form conductive pillars 207a as shown in FIG. 1H.

In the method for forming a semiconductor structure provided by the embodiments of the disclosure, a conductive layer is formed on a substrate, the conductive layer is etched to form a plurality of bit line grooves, and a bit line structure is formed in each bit line groove, so as to achieve electrical connection between the bit line structure and the active area, and a remaining portion of the conductive layer is etched along a second direction to form storage node contact structures. Thus, in the solutions provided by the embodiments of the disclosure, on the one hand, there is no need to form Bit Line Contact (BLC) structures between the bit line structures and the active areas, and on the other hand, there is no need to fill contact holes located between adjacent bit line structures to form the storage node contact structures after the bit line structures are formed, thereby simplifying a process and reducing or avoiding the problem of voids appearing at the bottoms of the storage node contact structures caused by too high depth-to-width ratio of the contact holes filled to form the storage node contact structures. In addition, there is no need to etch the substrate to form the storage node contact structures after the bit line structures are formed, thereby reducing or avoiding the problem of short circuit between the storage node contact structures and the bit line structures caused by an excessively high etching rate, and reducing the difficulty of the process.

Based on the method for forming the semiconductor structure shown in FIG. 1B, the embodiments of the disclosure provide a semiconductor structure. As shown in FIG. 1H, the semiconductor structure includes:

a substrate 200, in which active areas 201 arranged in a matrix and isolation structures 202 for isolating the active areas 201 from each other are formed in the substrate 200, a first direction (X-axis direction) is a column direction of the matrix and a second direction (Y-axis direction) is a row direction of the matrix, and a third direction (Z-axis direction) is an extension direction of each active area 201;

a plurality of bit line grooves 206 extending along the first direction and arranged along the second direction, in which each bit line groove 206 exposes one column of the active areas 201, and bottom surfaces of the plurality of bit line grooves 206 are lower than a top surface of the substrate 200;

a bit line structure 208 located in each bit line groove 206, in which a gap 206a is formed between the bit line structure 208 and each of two sides of a respective one of the plurality of bit line grooves 206; and conductive pillars 207a serving as storage node contact structures.

The difference between the semiconductor structure provided by the embodiments of the disclosure and the semiconductor structure in the related art lies in that: on the one hand, bit line contact structures are not included between the bit line structures and the active areas, thereby reducing a width-to-depth ratio of contact holes located between adjacent bit lines, and simplifying a process flow; on the other hand, since a conductive layer is first formed on the substrate, then the conductive layer is etched to form storage node contact structures, and the process of filling the contact holes located between adjacent bit lines is not required, the formed storage node contact structures are relatively dense, and no voids will appear at the bottoms of the formed storage node contact structures.

Figure 2A:
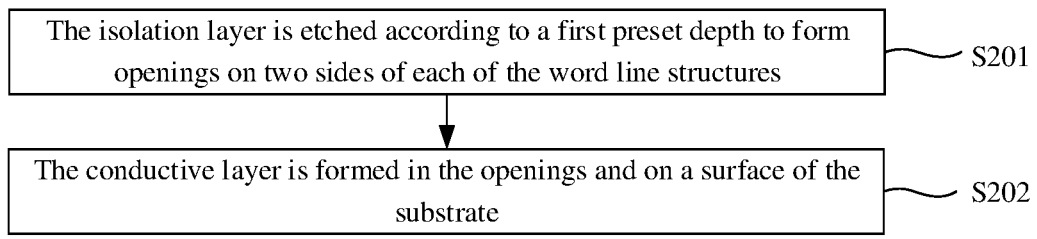
FIG. 2A is a schematic flowchart of an operation S20 in a method for forming a semiconductor structure provided by embodiments of the disclosure.

In some embodiments, word line structures arranged along the first direction and extending along the second direction and an isolation layer located between the word line structures and the substrate are formed in the substrate. As shown in FIG. 2A, S20 may be implemented through the following operations.

At S201, the isolation layer is etched according to a first preset depth to form openings on two sides of each of the word line structures.

Here, the isolation layer may be etched by a wet etching process or a dry etching process. A gas for the dry etching process may include at least one of the following: sulfur hexafluoride, carbon tetrafluoride, trifluoromethane, oxygen, or argon. Wet etching process refers to etching an area to be etched by using a liquid chemical. The device for a wet etching process is simple and the process is mature. A selectivity ratio of an oxide to silicon in the wet etching process are better than a selectivity ratio of an oxide to silicon in the dry etching process, and thus the silicon on sidewalls will not be damaged during the wet etching process.

At S202, the conductive layer is formed in the openings and on a surface of the substrate. Thus, contact areas between the conductive layer and the active areas can be increased, the conductivity of the conductive layer and the active areas can be improved, and better conductivity can be provided.

Figure 2B:
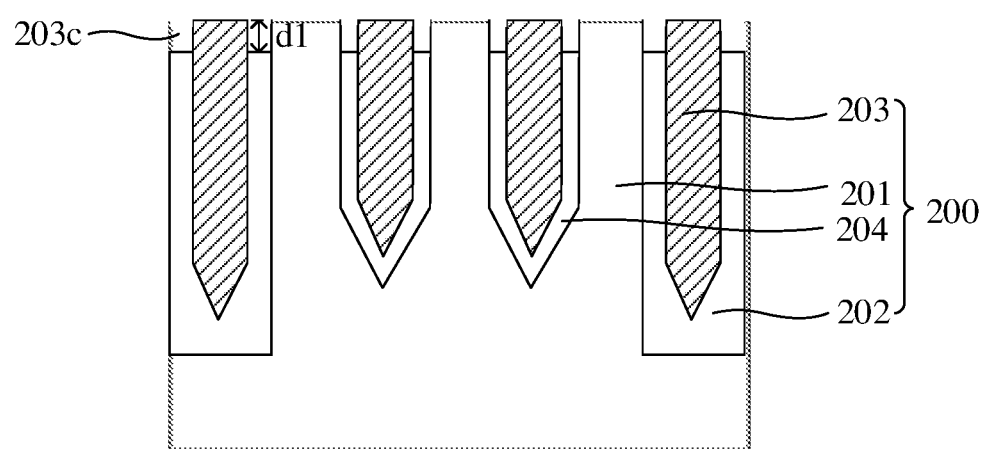
FIG. 2B to FIG. 2F are schematic diagrams of a process for forming a semiconductor structure provided by embodiments of the disclosure.
Figure 2C:
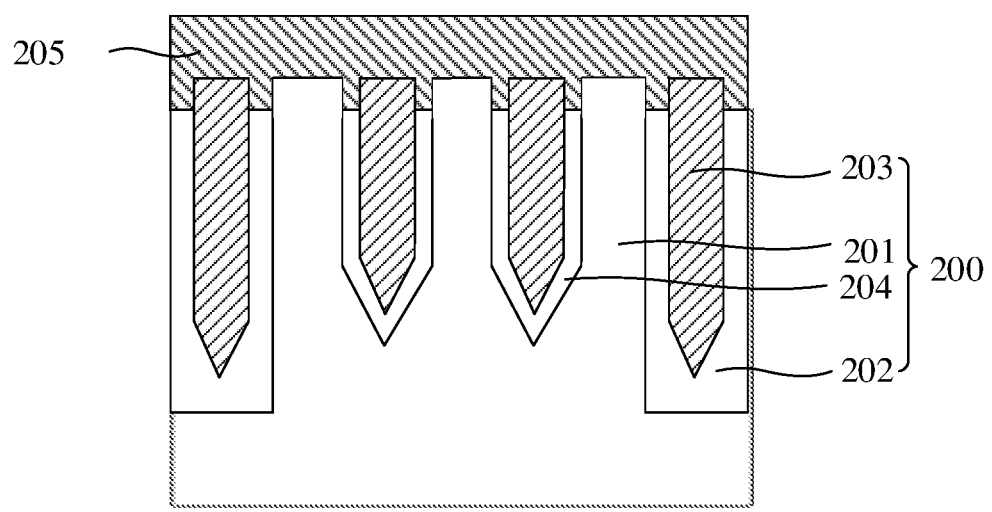

Next, with reference to FIG. 2B and FIG. 2C, S201 and S202 are further described in detail. With reference to FIG. 2B, word line structures 203 arranged along the X-axis direction and extending along the Y-axis direction and an isolation layer 204 located between the word line structures 203 and the substrate 200 are formed in the substrate 200. The isolation layer 204 is etched according to a first preset depth d1 to form openings 203c on two sides of each of the word line structures 203, that is, the depth of each of the openings 203c is d1. A conductive layer 205 as shown in FIG. 2C is formed in the openings 203c and on a surface of the substrate 200.

In some embodiments, S30 may be implemented through the following operation. The plurality of bit line grooves and the plurality of conductive lines are formed by using a lower surface of the conductive layer as an etching stop position. Here, the bottom surfaces of the plurality of bit line grooves are lower than the top surface of the substrate.

Figure 2D:
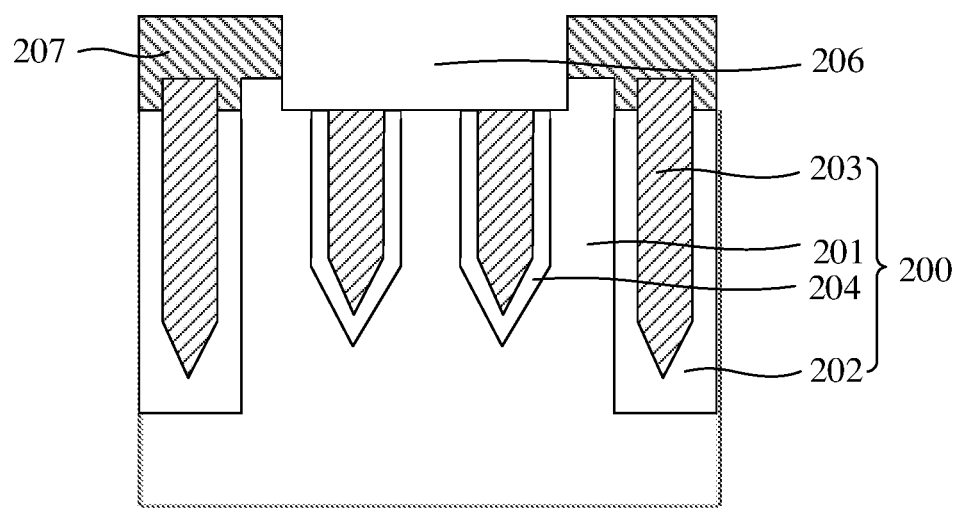

With reference to FIG. 2C, the plurality of bit line grooves 206 and the plurality of conductive lines 207 as shown in FIG. 2D are formed by using the lower surface of the conductive layer 205 as the etching stop position.

In some embodiments, each word line structure includes a word line metal layer and a word line dielectric layer. S30 includes the following operation. The conductive layer, a part of the active areas, and the word line dielectric layers in a part of the word line structures are etched to form the plurality of bit line grooves and the plurality of conductive lines.

Figure 2E:
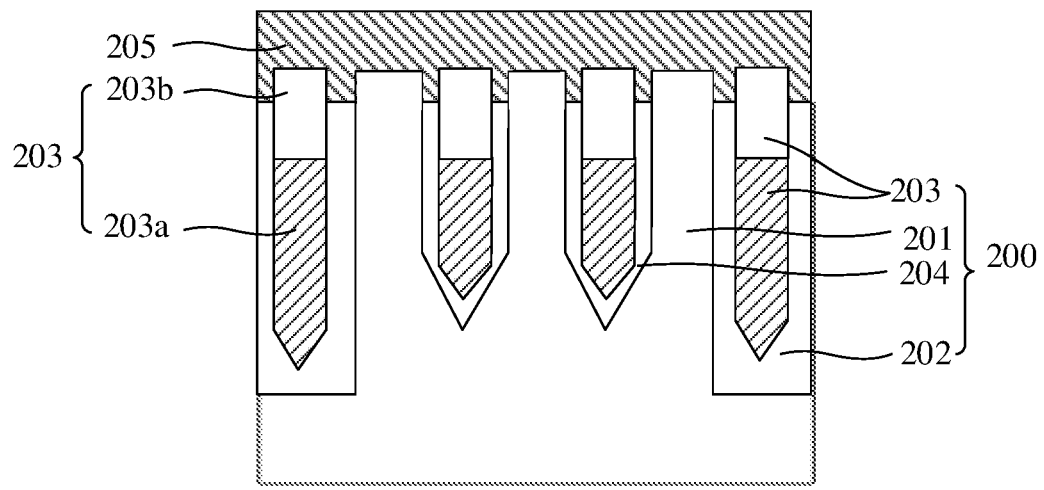
Figure 2F:
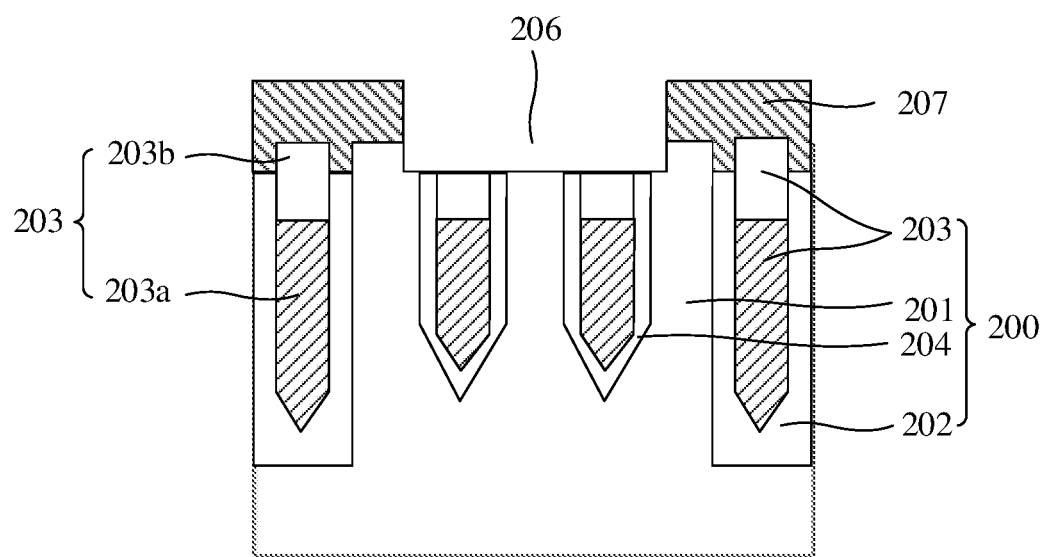

With reference to FIG. 2E, each word line structure 203 includes a word line metal layer 203a and a word line dielectric layer 203b. The word line dielectric layer 203b is located on the word line metal layer 203a. The conductive layer 205, a part of the active areas 201, and the word line dielectric layers 203b in a part of the word line structures 203 are etched to form the plurality of bit line grooves 206 and the plurality of conductive lines 207 as shown in FIG. 2F.

Here, the word line dielectric layer is configured to protect the word line metal layer in the subsequent process, so as to prevent the device from deteriorating caused by the word line metal layer being oxidized in the subsequent process. Exemplarily, the material of a word line dielectric layer is silicon nitride, and the material of the word line metal layer may be a metal material, such as tungsten (W), cobalt (Co), copper (Cu), aluminum (Al), polysilicon, doped silicon, silicide, or any combination thereof.

In some embodiments, S30 may be implemented through the following operation. The conductive layer and a part of the substrate are etched to form the plurality of bit line grooves and the plurality of conductive lines.

Figure 3A:
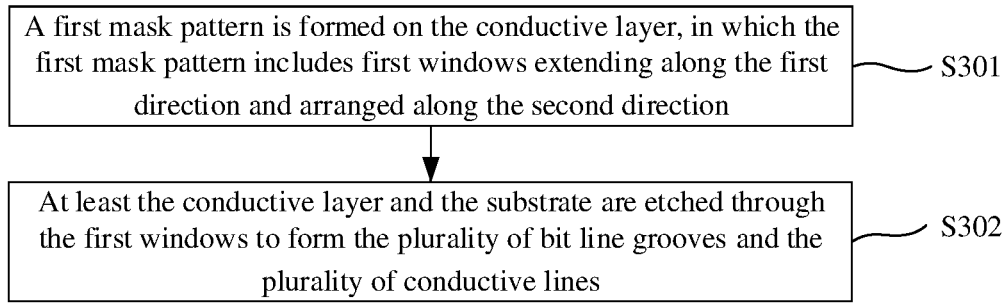
FIG. 3A is a schematic flowchart of an operation S30 in a method for forming a semiconductor structure provided by embodiments of the disclosure.

In some embodiments, as shown in FIG. 3A, S30 may be implemented through the following operations.

At S301, a first mask pattern is formed on the conductive layer, in which the first mask pattern includes first windows extending along the first direction and arranged along the second direction.

At S302, at least the conductive layer and the substrate are etched through the first windows to form the plurality of bit line grooves and the plurality of conductive lines.

Figure 3B:
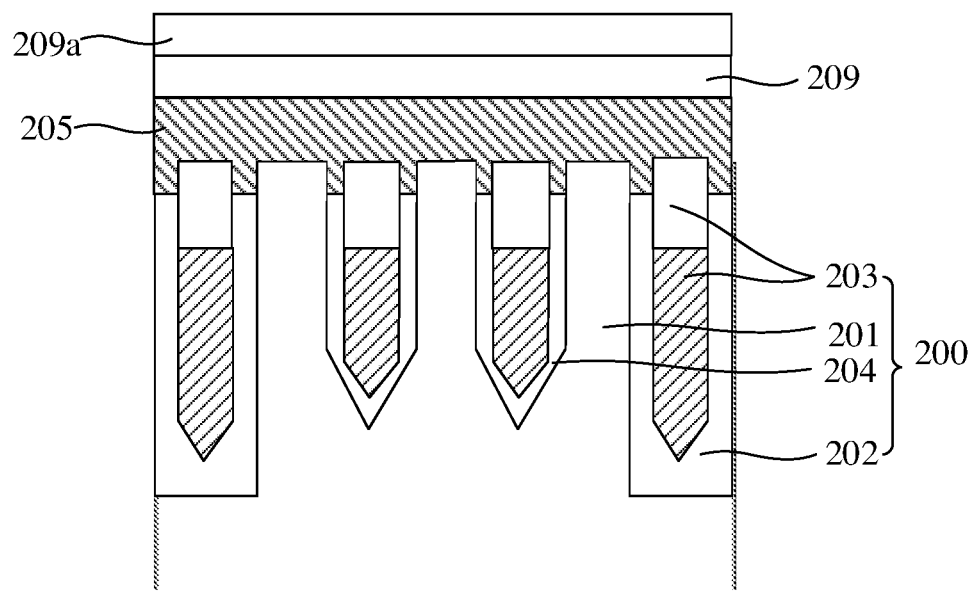
FIG. 3B to FIG. 3C are schematic diagrams of a process for forming a semiconductor structure provided by embodiments of the disclosure.
Figure 3C:
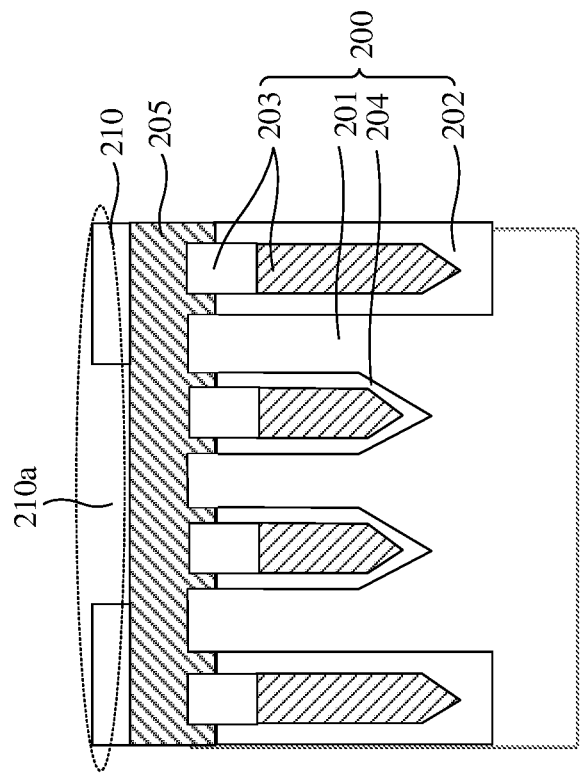
Figure 3C:
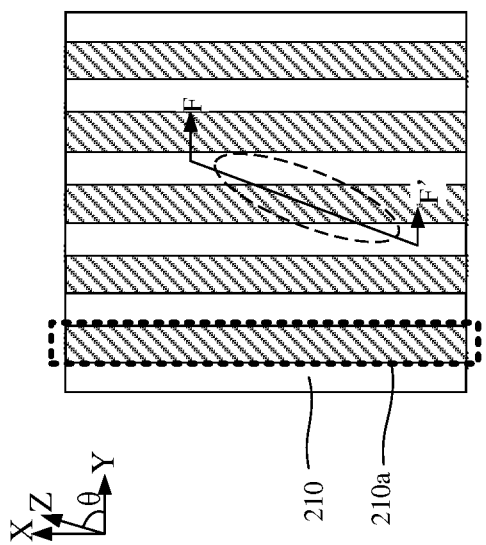

Next, with reference to FIG. 3B, FIG. 3C, and FIG. 2F, S301 and S302 are further described in detail. As shown in FIG. 3B, a first mask layer 209 is formed on the conductive layer 205, a first photoresist layer 209a is formed on the first mask layer 209, and an initial first mask pattern is formed in the first photoresist layer 209a through processes such as exposure and development. The first mask layer 209 is etched by using the initial first mask pattern as a mask, in which the initial first mask pattern is transferred into the first mask layer 209, and a remaining portion of the first mask layer 209 forms a first mask pattern 210 as shown in FIG. 3C. The left diagram in FIG. 3C shows the layout of the first mask pattern 210 and the right diagram in FIG. 3C shows a cross-sectional diagram along F-F. As shown in the left diagram in FIG. 3C, the first mask pattern 210 includes first windows 210a extending along the X-axis direction and arranged along the Y-axis direction.

With reference to FIG. 3C, at least the conductive layer 205 and the substrate 200 are etched through the first windows 210a to form the plurality of bit line grooves 206 and the plurality of conductive lines 207 as shown in FIG. 2F.

In some embodiments, the material of the first photoresist layer may be a photoresist, which refers to a thin film material, the solubility of which is changed through irradiation or radiation of ultraviolet light, electron beams, ion beams, X-rays, or the like.

The material of the first mask layer may be one or more of silicon nitride, silicon oxynitride, silicon carbide, amorphous carbon, polysilicon, hafnium oxide, titanium oxide, zirconium oxide, titanium nitride, tantalum nitride, and titanium, and the first mask layer may be formed by any of the following processes: Chemical Vapor Deposition (CVD), Physical Vapor Deposition (PVD), Atomic Layer Deposition (ALD), and any other suitable deposition process.

Figure 4A:
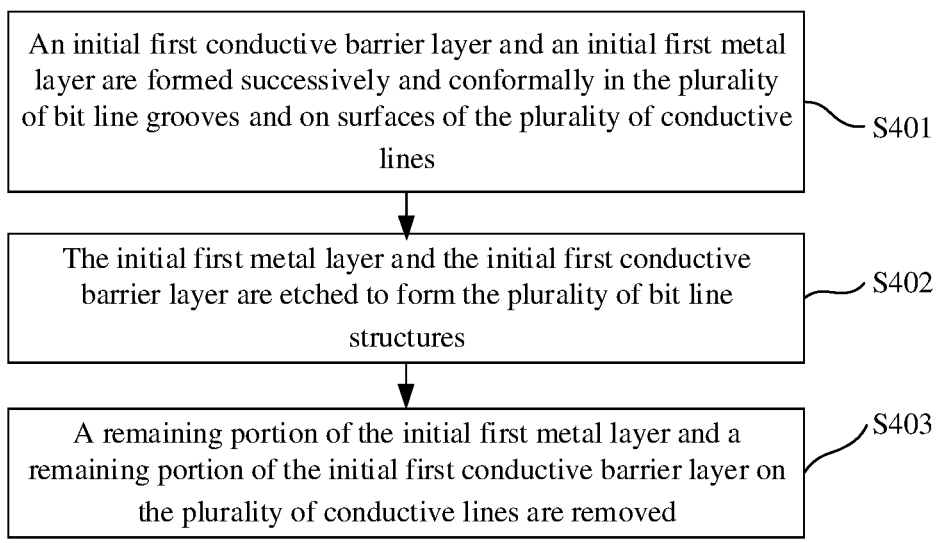
FIG. 4A is a schematic flowchart of an operation S40 in a method for forming a semiconductor structure provided by embodiments of the disclosure.

In some embodiments, each bit line structure includes a first conductive barrier layer and a first metal layer. As shown in FIG. 4A, S40 may be implemented through S401 to S403.

At S401, an initial first conductive barrier layer and an initial first metal layer are formed successively and conformally in the plurality of bit line grooves and on surfaces of the plurality of conductive lines.

At S402, the initial first metal layer and the initial first conductive barrier layer are etched to form the bit line structures.

At S403, a remaining portion of the initial first metal layer and a remaining portion of the initial first conductive barrier layer on the plurality of conductive lines are removed.

Figure 4B:
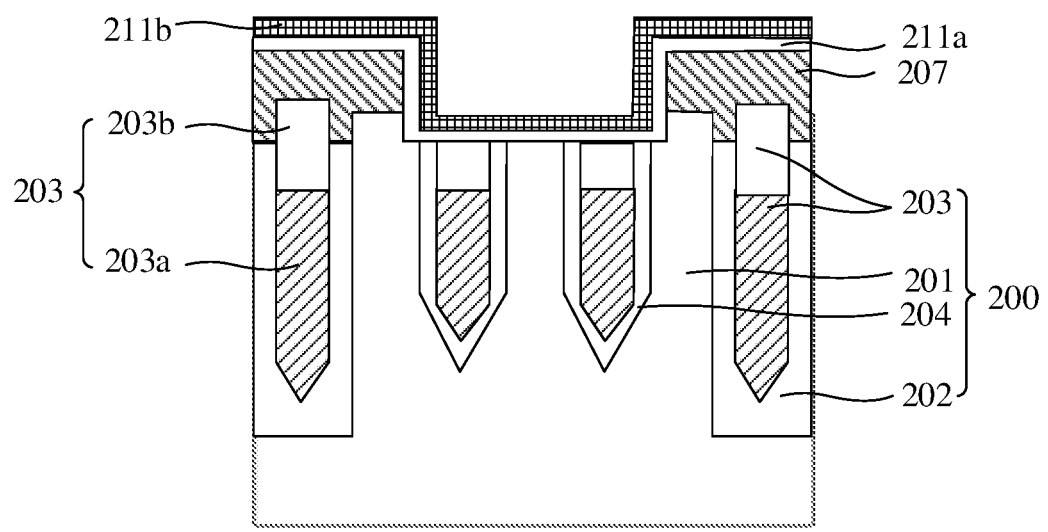
FIG. 4B to FIG. 4F are schematic diagrams of a process for forming a semiconductor structure provided by embodiments of the disclosure.
Figure 4C:
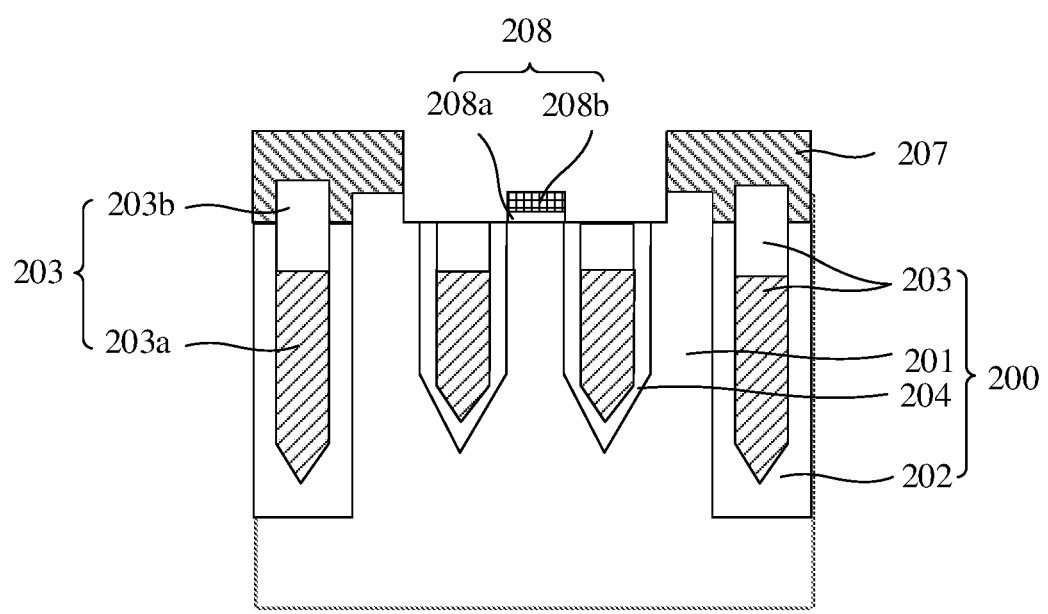

According to S401 to S403, the semiconductor structure as shown in FIG. 4C may be formed. With reference to FIG. 4C, each bit line structure 208 includes a first conductive barrier layer 208a and a first metal layer 208b.

Next, with reference to FIG. 2F, FIG. 4B, and FIG. 4C, S401 and S403 are further described in detail. With reference to FIG. 2F, an initial first conductive barrier layer 211a and an initial first metal layer 211b as shown in FIG. 4B are formed successively and conformally in the plurality of bit line grooves 206 and on the surfaces of the plurality of conductive lines 207; and the initial first metal layer 211b and initial first conductive barrier layer 211a are etched to form the bit line structures 208 shown in FIG. 4C.

The first conductive barrier layer is configured to prevent the metal material forming the first metal layer from infiltrating into the active areas. The active areas are configured form the semiconductor structure. If the metal material forming the first metal layer infiltrates into the active areas, the semiconductor structure in the active areas may fail. In addition, the first conductive barrier layer is configured to improve the viscosity between the first metal layer and the active areas, thereby improving the conductivity of the bit line structures.

In some embodiments, the material of the first metal layer may be a conductive metal, for example, one or more of tungsten (W), cobalt (Co), copper (Cu), aluminum (Al), polysilicon, doped silicon, silicide, or any combination thereof. The material of the first conductive barrier layer is metal tantalum, tantalum nitride, titanium nitride, or the like, and the first conductive barrier layer may be formed through any suitable deposition process.

In some embodiments, S402 may be implemented through S4021 to S4023.

At S4021, a first sacrificial layer and a second mask pattern are formed successively on the initial first metal layer, in which the second mask pattern includes second windows extending along the first direction and arranged along the second direction.

At S4022, the first sacrificial layer, the initial first metal layer, and the initial first conductive barrier layer are etched through the second windows to form the bit line structures.

At S4023, a remaining portion of the first sacrificial layer is removed.

Figure 4D:
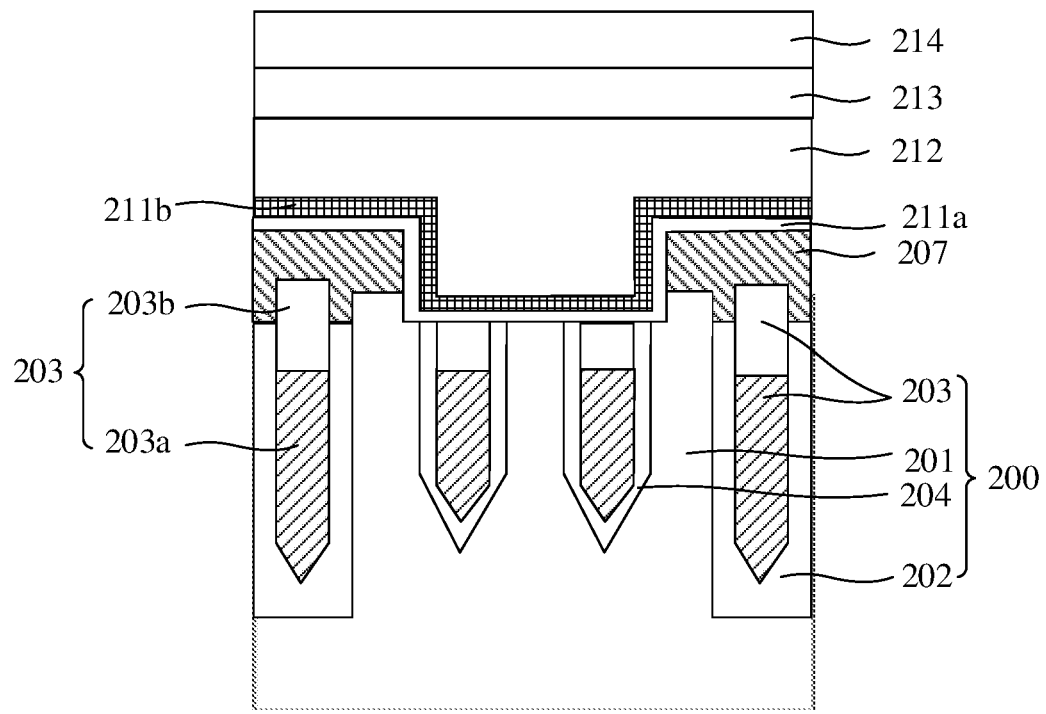
Figure 4E:
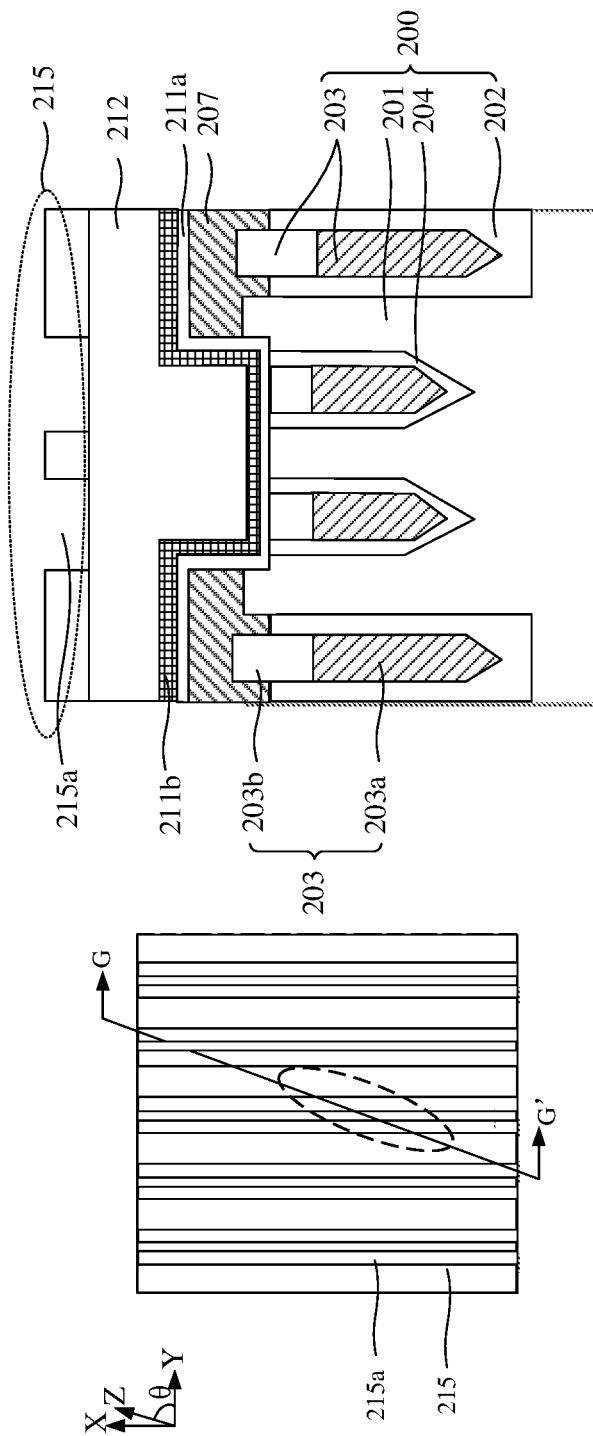

Next, with reference to FIG. 4C to FIG. 4E, S4021 and S4023 are further described in detail. With reference to FIG. 4D, a first sacrificial layer 212, a second mask layer 213, and a second photoresist layer 214 are formed successively on the initial first metal layer 211b. Here, the function of the first sacrificial layer 212 is to compensate for an offset between the bit line structures 208 and the surfaces of the plurality of conductive lines 207, and on this basis, the second mask layer 213 and the second photoresist layer 214 are easily disposed.

With reference to FIG. 4D, an initial second mask pattern is formed in the second photoresist layer 214 through processes such as exposure and development. The second mask layer 213 is etched by using the initial second mask pattern as a mask, in which the initial second mask pattern is transferred into the first mask layer 209, and a remaining portion of the second mask layer 213 forms a second mask pattern 215 as shown in FIG. 4E. The left diagram in FIG. 4E shows the layout of the second mask pattern 215 and the right diagram in FIG. 4E shows a cross-sectional diagram along G-G'. As shown in the left diagram in FIG. 4E, the second mask pattern 215 includes second windows 215a extending along the X-axis direction and arranged along the Y-axis direction, and the second mask pattern 215 includes long lines with different widths.

With reference to FIG. 4E, the first sacrificial layer 212, the initial first metal layer 211b, and the initial first conductive barrier layer 211a are etched through the second windows 215a to form the bit line structures 208 shown in FIG. 4C.

In some embodiments, the first sacrificial layer may be a Spin-On Hard Mask (SOH) or other hard mask layers. The material of the second mask layer 213 may be the same as the material of the first mask layer 209. The material of the second photoresist layer 214 is the same as the material of the first photoresist layer 209a.

Figure 4F:
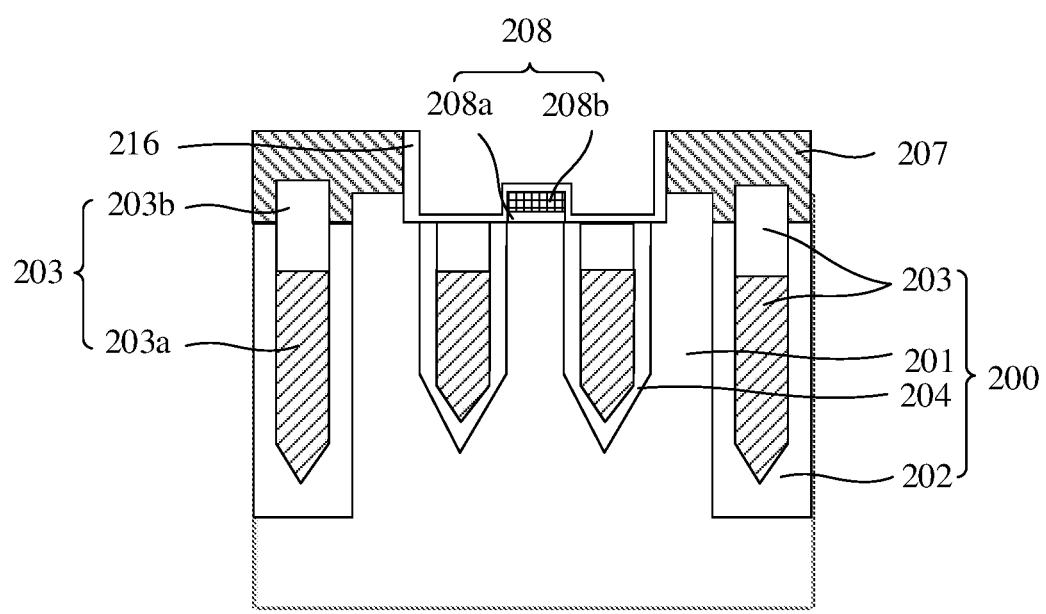

In some embodiments, after S40 and before S50, the method further includes the following operation. At A0, a first insulation layer is formed in each bit line groove. With reference to FIG. 4F, a first insulation layer 216 is formed in each bit line groove (with reference to the bit line groove 206 in FIG. 2F). Here, the material of the first insulation layer may be silicon nitride.

Figure 5A:
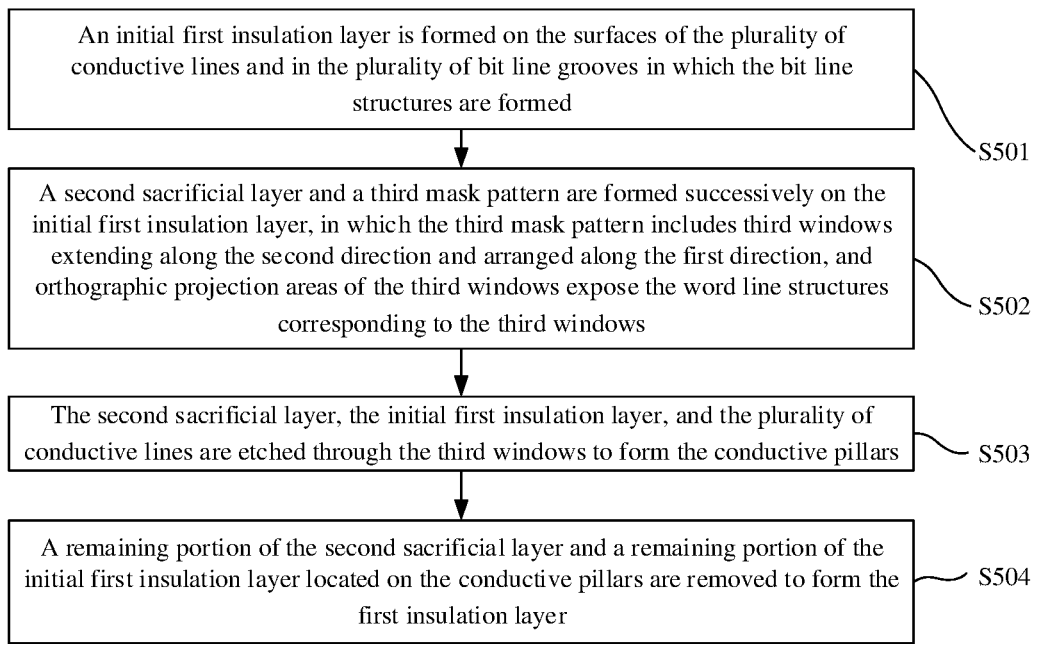
FIG. 5A is a schematic flowchart of an operation A0 and an operation S50 in a method for forming a semiconductor structure provided by embodiments of the disclosure.

In some embodiments, with reference to FIG. 5A, A0 and S50 may be implemented through S501 to S504.

At S501, an initial first insulation layer is formed on the surfaces of the plurality of conductive lines and in the plurality of bit line grooves in which the bit line structures are formed.

Here, the initial first insulation layer may be formed by CVD, PVD, ALD, and any other suitable deposition process.

Figure 5B:
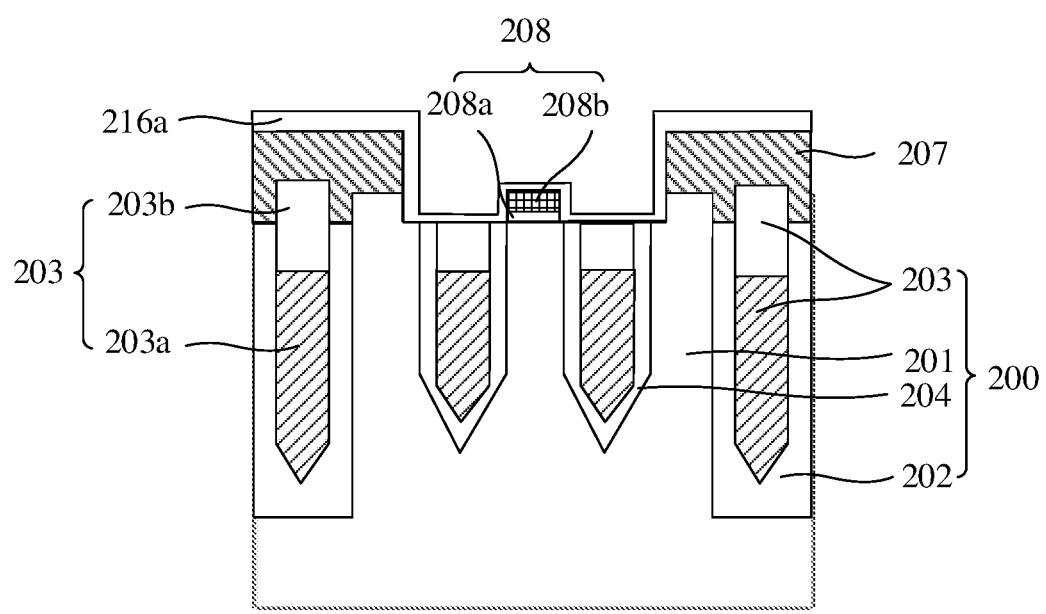
FIG. 5B to FIG. 5H are schematic diagrams of a process for forming a semiconductor structure provided by embodiments of the disclosure.

With reference to FIG. 5B, an initial first insulation layer 216a is formed on the surfaces of the plurality of conductive lines 207 and in the plurality of bit line grooves (with reference to FIG. 4C) in which the bit line structures 208 are formed.

At S502, a second sacrificial layer and a third mask pattern are formed successively on the initial first insulation layer, in which the third mask pattern includes third windows extending along the second direction and arranged along the first direction, and orthographic projection areas of the third windows expose the word line structures corresponding to the third windows.

Here, the third mask pattern may be formed by using a photoresist through processes such as exposure and development.

Figure 5C:
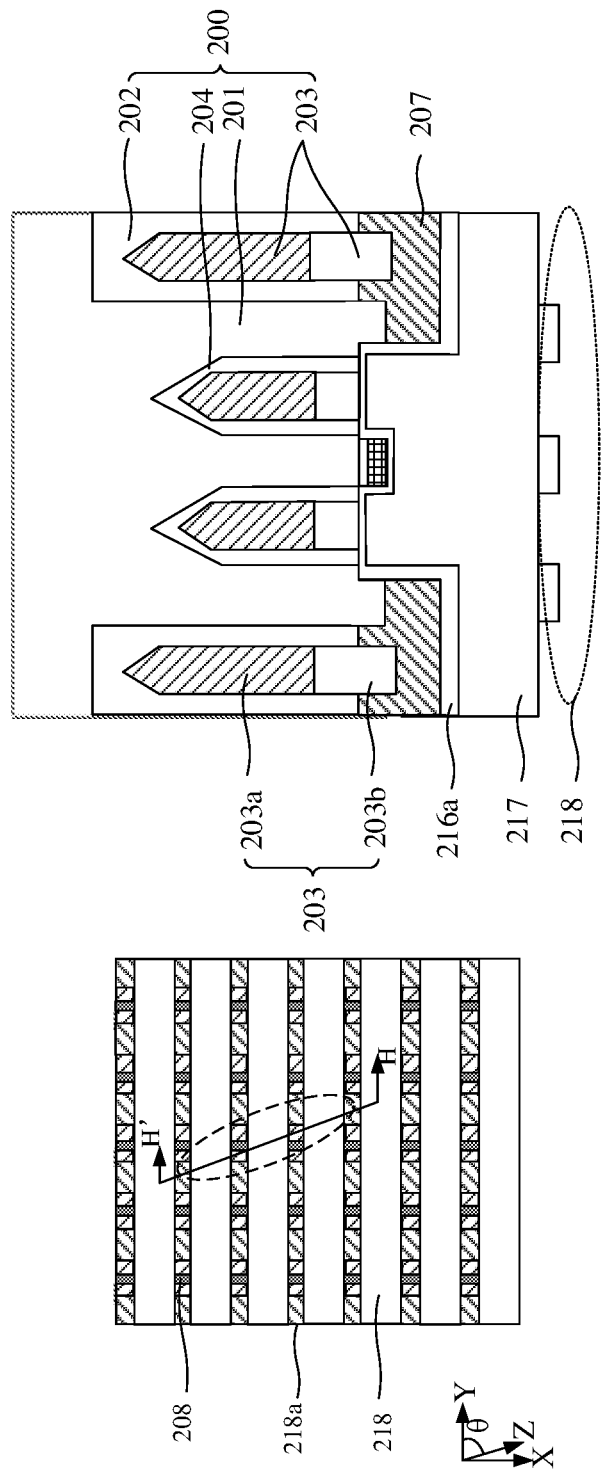

The left diagram in FIG. 5C shows the layout of a third mask pattern 218 and the right diagram in FIG. 5C shows a cross-sectional diagram along H-H'. A second sacrificial layer 217 and the third mask pattern 218 are formed successively on the initial first insulation layer 216a. The third mask pattern 218 includes third windows 218a extending along the Y-axis direction and arranged along the X-axis direction, and orthographic projection areas of the third windows 218a expose the word line structure 203 corresponding to the third windows 218a. The left diagram in FIG. 5C does not show the initial first insulation layer 216a and the second sacrificial layer 217, and thus the third windows 218a can directly expose a part of the word line structures 203 and a part of the bit line structures 208.

In some embodiments, the second sacrificial layer is an SOH.

At S503, the second sacrificial layer, the initial first insulation layer, and the plurality of conductive lines are etched through the third windows to form the conductive pillars.

At S504, a remaining portion of the second sacrificial layer and a remaining portion of the initial first insulation layer located on the conductive pillars are removed to form the first insulation layer.

Figure 5D:
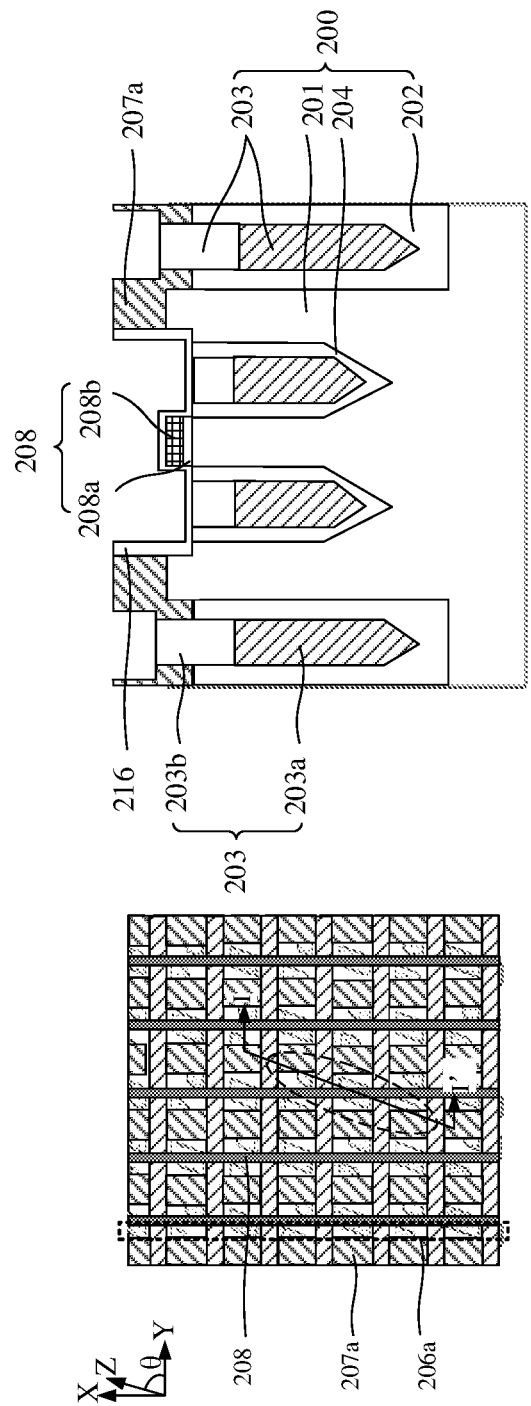

With reference to FIG. 5C, the second sacrificial layer 217 and the initial first insulation layer 216a are etched through the third windows 218a, and the remaining portion of the second sacrificial layer 217 and the remaining portion of the initial first insulation layer 216a located on the conductive pillars 207a are removed, to form the conductive pillars 207a and the first insulation layer 216 as shown in FIG. 5D. The left diagram in FIG. 5D shows the layout of the conductive pillars 207a and the right diagram in FIG. 5D shows a cross-sectional diagram along I-I'. The first insulation layer 216 covers the bit line structures 208. Thus, the storage node contact structures do not need to be formed by filling contact holes located between the bit line structures, thereby avoiding the problem of voids formed due to the too high depth-to-width ratio of the contact holes located between the bit line structures during filling.

In some embodiments, after S504, the method further includes S505. At S505, a second insulation layer is filled between the adjacent conductive pillars, in which a surface of the second insulation layer is flush with surfaces of the storage node contact structures. The second insulation layer may be a spin-on insulation dielectric layer, for example, a silicon oxide layer. During implementation, the formed silicon oxide layer will be higher than the surfaces of the storage node contact structures, and Chemical Mechanical Polishing (CMP) may be used to make the silicon oxide layer to be flush with the surfaces of the storage node contact structures.

Figure 5E:
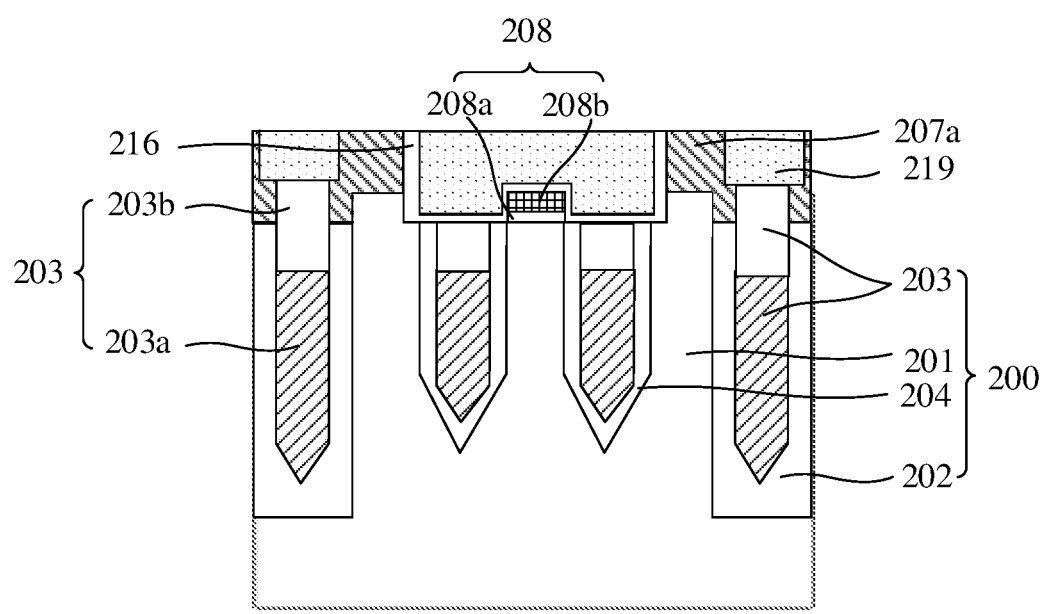

With reference to FIG. 5E, a second insulation layer 219 is filled between adjacent conductive pillars 207a, in which an upper surface of the second insulation layer 219 is flush with upper surfaces of the conductive pillars 207a.

In the method for forming a semiconductor structure provided by the embodiments of the disclosure, a conductive layer is etched to form a plurality of conductive lines, the plurality of conductive lines are etched to form conductive pillars, and insulation structures are formed between the conductive pillars and word line structures, in which the insulation structures may be N—O—N structures. The dielectric constant of the N—O—N structures is very small, and thus parasitic capacitance between the bit line structures and the storage node contact structures can be reduced.

In some embodiments, after S505, the method further includes S506. At S506, a second conductive barrier layer and a second metal layer are formed successively on a surface of the second insulation layer and surfaces of the conductive pillars. Here, the second conductive barrier layer may be made of the same material as the first conductive barrier layer, and may be made of titanium nitride. The second metal layer may be made of the same material as the first metal layer, and may be made of tungsten.

Figure 5F:
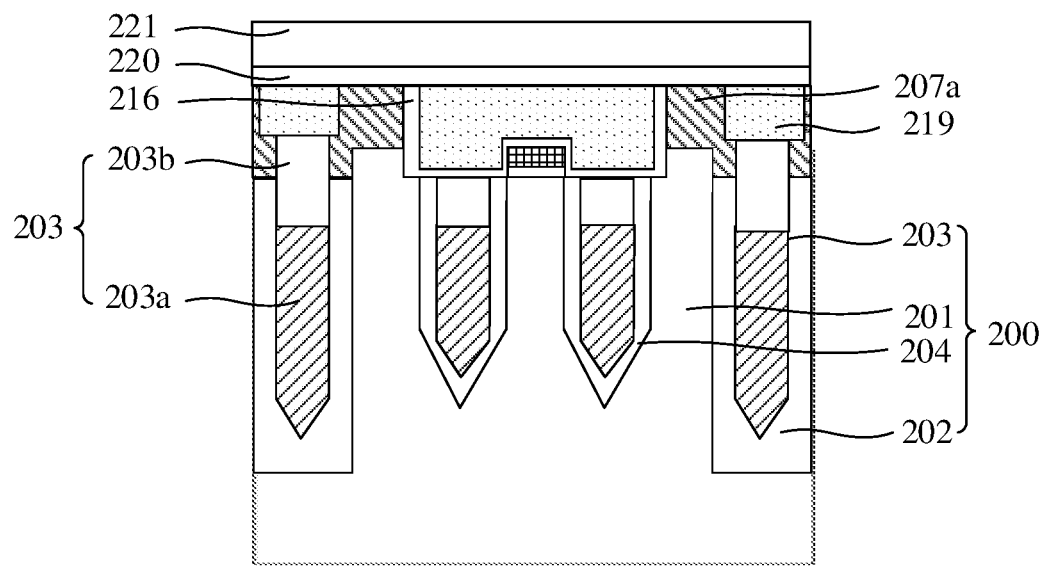

With reference to FIG. 5F, a second conductive barrier layer 220 and a second metal layer 221 are formed successively on a surface of the second insulation layer 219 and surfaces of the conductive pillars 207a.

In some embodiments, after S505, the method further includes S5051 and S5052.

Figure 5G:
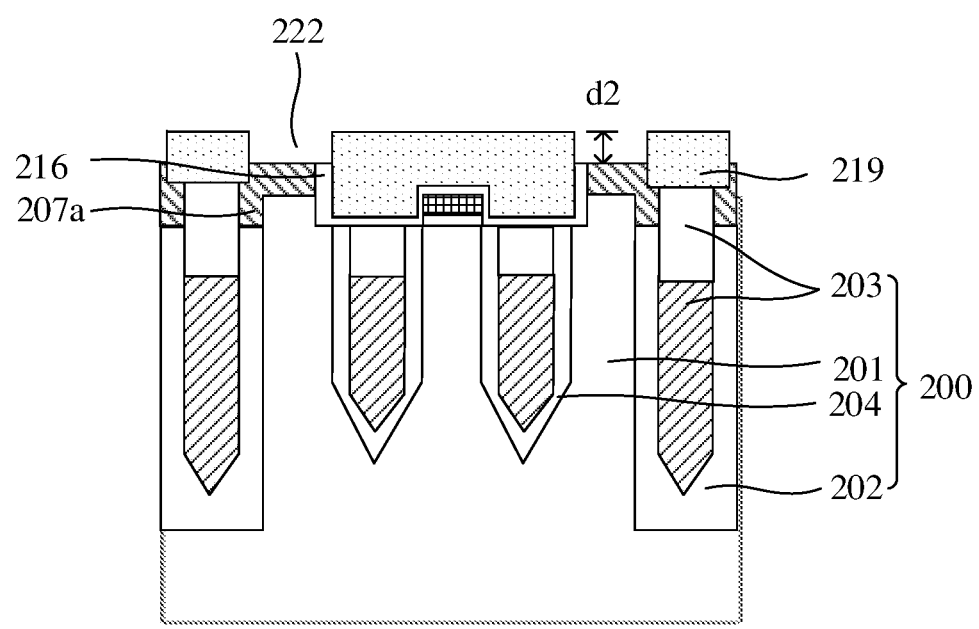

At S5051, with reference to FIG. 5E, the conductive pillars 207a and the first insulation layer 216 on sidewalls of the conductive pillars 207a are etched according to a second preset depth d2 by using isotropic etching to form grooves 222 with the second preset depth d2 as shown in FIG. 5G. Top surfaces of the etched conductive pillars 207a are lower than a top surface of the second insulation layer 219.

Here, an etching ratio may range from 1:10 to 1:100. The use of the isotropic etching will not affect the second insulation layer nearby.

Figure 5H:
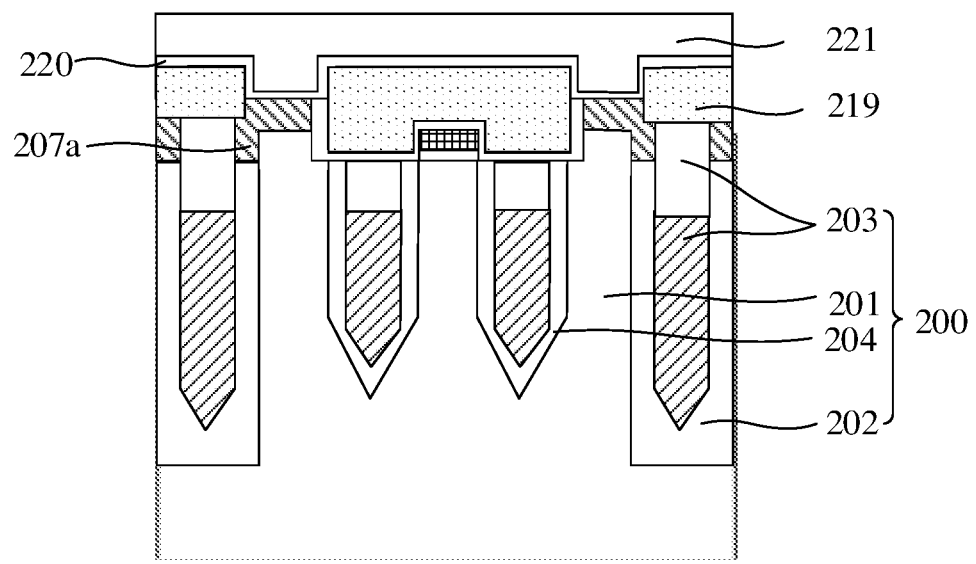

At S5052, with reference to FIG. 5G, a second conductive barrier layer 220 and a second metal layer 221 as shown in FIG. 5H are formed successively in the grooves 222 with the second preset depth d2 and on the second insulation layer 219.

During implementation, the second metal layer may serve as a landing pad for connecting to a capacitor structure. After the second metal layer is formed by means of filling, CMP further needs to be performed on the second metal layer to provide a smooth surface for the subsequent process.

In some embodiments, with reference to FIG. 5G, the semiconductor structure further includes: a first insulation layer 216 located in each bit line groove; and a second insulation layer 219 between adjacent conductive pillars 207a.

Top surfaces of the conductive pillars 207a are lower than a top surface of the second insulation layer 219.

In some embodiments, with reference to FIG. 5H, the semiconductor structure further includes: a second conductive barrier layer 220 and a second metal layer 221 formed successively on the second insulation layer 219 and the conductive pillars 207a.

The features disclosed in the embodiments of the method or the embodiments of the semiconductor structure provided in the disclosure may be combined arbitrarily without conflict to obtain new embodiments of the method or new embodiments of the semiconductor structure.

The descriptions of the above embodiments of the semiconductor structure embodiments are similar to the descriptions of the above embodiments of the method, and have similar beneficial effects to the embodiments of the method. For technical details not disclosed in the embodiments of the semiconductor structure of the disclosure, please refer to the descriptions of the embodiments of the method of the disclosure for understanding.

The foregoing descriptions are merely exemplary embodiments of the disclosure, and are not intended to limit the scope of protection of the disclosure. Any modification, equivalent replacement, improvement and the like made within the spirit and principle of the disclosure shall fall within the scope of protection of the disclosure.

The invention claimed is:

1. A method for forming a semiconductor structure, comprising:
   providing a substrate, wherein active areas arranged in a matrix and isolation structures for isolating the active areas from each other are formed in the substrate, a first direction is a column direction of the matrix and a second direction is a row direction of the matrix, and a third direction is an extension direction of each active area;
   forming a conductive layer on the substrate;
   etching the conductive layer to form a plurality of bit line grooves extending along the first direction and arranged along the second direction and a plurality of conductive lines extending along the first direction and arranged along the second direction, wherein each bit line groove exposes one column of the active areas, and bottom surfaces of the plurality of bit line grooves are lower than a top surface of the substrate;
   forming a bit line structure in each of the plurality of bit line grooves, wherein a gap is formed between the bit line structure and each of two sides of a respective one of the plurality of bit line grooves; and
   etching the plurality of conductive lines along the second direction to form conductive pillars serving as storage node contact structures.

2. The method of claim 1, wherein word line structures arranged along the first direction and extending along the second direction and an isolation layer located between the word line structures and the substrate are formed in the substrate,
   wherein forming the conductive layer on the substrate comprises:
   etching the isolation layer according to a first preset depth to form openings on two sides of each of the word line structures; and
   forming the conductive layer in the openings and on a surface of the substrate.

3. The method of claim 2, wherein etching at least the conductive layer to form the plurality of bit line grooves extending along the first direction and arranged along the second direction and the plurality of conductive lines extending along the first direction and arranged along the second direction comprises:
   forming the plurality of bit line grooves and the plurality of conductive lines by using a lower surface of the conductive layer as an etching stop position.

4. The method of claim 1, wherein etching at least the conductive layer to form the plurality of bit line grooves extending along the first direction and arranged along the second direction and the plurality of conductive lines extending along the first direction and arranged along the second direction comprises:
   etching the conductive layer and a part of the substrate to form the plurality of bit line grooves and the plurality of conductive lines.

5. The method of claim 1, wherein etching at least the conductive layer to form the plurality of bit line grooves extending along the first direction and arranged along the second direction and the plurality of conductive lines extending along the first direction and arranged along the second direction comprises:
   forming a first mask pattern on the conductive layer, wherein the first mask pattern comprises first windows extending along the first direction and arranged along the second direction; and
   etching at least the conductive layer and the substrate through the first windows to form the plurality of bit line grooves and the plurality of conductive lines.

6. The method of claim 1, wherein the bit line structure comprises a first conductive barrier layer and a first metal layer, and wherein forming the bit line structure in each bit line groove comprises:
   forming successively and conformally an initial first conductive barrier layer and an initial first metal layer in the plurality of bit line grooves and on surfaces of the plurality of conductive lines;
   etching the initial first metal layer and the initial first conductive barrier layer to form the bit line structure; and
   removing a remaining portion of the initial first metal layer and a remaining portion of the initial first conductive barrier layer on the plurality of conductive lines.

7. The method of claim 6, wherein etching the initial first metal layer and the initial first conductive barrier layer to form the bit line structure comprises:
   forming successively a first sacrificial layer and a second mask pattern on the initial first metal layer, wherein the second mask pattern comprises second windows extending along the first direction and arranged along the second direction;
   etching the first sacrificial layer, the initial first metal layer, and the initial first conductive barrier layer through the second windows to form the bit line structure; and
   removing a remaining portion of the first sacrificial layer.

8. The method of claim 1, wherein after forming the bit line structure in each bit line groove, the method further comprising:
   forming a first insulation layer in each bit line groove.

9. The method of claim 8, wherein the forming the first insulation layer in each bit line groove, and etching the plurality of conductive lines along the second direction to form conductive pillars serving as storage node contact structures comprise:
   forming an initial first insulation layer on surfaces of the plurality of conductive lines and in the plurality of bit line grooves in which the bit line structure is formed;
   forming successively a second sacrificial layer and a third mask pattern on the initial first insulation layer, wherein the third mask pattern comprises third windows extending along the second direction and arranged along the first direction, and orthographic projection areas of the third windows expose the word line structures corresponding to the third windows;

etching the second sacrificial layer, the initial first insulation layer, and the plurality of conductive lines through the third windows to form the conductive pillars; and removing a remaining portion of the second sacrificial layer and a remaining portion of the initial first insulation layer located on the conductive pillars to form the first insulation layer.

10. The method of claim 9, further comprising:

filling a second insulation layer between adjacent conductive pillars, wherein a surface of the second insulation layer is flush with surfaces of the storage node contact structures.

11. The method of claim 10, further comprising:

forming successively a second conductive barrier layer and a second metal layer on the surface of the second insulation layer and the surfaces of the conductive pillars.

12. The method of claim 10, further comprising:

etching the conductive pillars and the first insulation layer on sidewalls of the conductive pillars according to a second preset depth by using isotropic etching to form grooves with the second preset depth, wherein top surfaces of the etched conductive pillars are lower than a top surface of the second insulation layer; and forming successively a second conductive barrier layer and a second metal layer in the grooves with the second preset depth and on the second insulation layer.

13. The method of claim 2, wherein etching the isolation layer according to the first preset depth is performed by using wet etching.

* * * * *